(12) United States Patent
Kikuchi

(10) Patent No.: US 7,692,300 B2
(45) Date of Patent: Apr. 6, 2010

(54) PRINTED CIRCUIT BOARD AND CIRCUIT STRUCTURE FOR POWER SUPPLY

(75) Inventor: Masanori Kikuchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 205 days.

(21) Appl. No.: 11/755,703

(22) Filed: May 30, 2007

(65) Prior Publication Data
US 2007/0290324 A1 Dec. 20, 2007

(30) Foreign Application Priority Data
Jun. 16, 2006 (JP) ............................. 2006-166820
May 15, 2007 (JP) ............................. 2007-129306

(51) Int. Cl.
*H01L 23/48* (2006.01)
*H01L 23/52* (2006.01)
*H01L 29/40* (2006.01)

(52) U.S. Cl. ...................... 257/750; 257/700; 257/758; 438/106; 438/115; 438/116

(58) Field of Classification Search ................ 257/678, 257/707, 691, 698, 700, 679, 748, 760, 780, 257/782, 783, 750, 758; 438/106, 115, 116
See application file for complete search history.

(56) References Cited

U.S. PATENT DOCUMENTS 6,075,211 A 6/2000 Tohya et al. ................. 174/255

| | | | |
|---|---|---|---|
| 6,177,294 B1 * | 1/2001 | Nakatake | 438/106 |
| 6,384,476 B2 * | 5/2002 | Takeuchi | 257/691 |
| 2002/0060366 A1 * | 5/2002 | Kikuchi et al. | 257/776 |
| 2005/0156277 A1 * | 7/2005 | Nakano et al. | 257/532 |

FOREIGN PATENT DOCUMENTS

| JP | 9-139573 | 5/1997 |
|---|---|---|
| JP | 2003-318352 | 11/2003 |

OTHER PUBLICATIONS

A machine translation of Foreign Patent Document #JP2003-318352 has been provided.*

* cited by examiner

*Primary Examiner*—Zandra Smith
*Assistant Examiner*—Telly D Green
(74) *Attorney, Agent, or Firm*—Fitzpatrick, Cella, Harper & Scinto

(57) ABSTRACT

In a printed circuit board, a semiconductor including plural power supply terminals and a semiconductor chip is mounted onto a mounting surface of a printed wiring board, and a bypass capacitor for reducing a power ground noise is provided. Another bypass capacitor, which is connected to the bypass capacitor only within an IC chip is provided to inhibit the power ground noise from causing not only a variation in timing of the IC chip and a malfunction thereof but also a malfunction of another IC chip and the generation of an EMI noise in a case where the power ground noise propagates to a power supply side.

16 Claims, 28 Drawing Sheets

PRINTED CIRCUIT BOARD AND CIRCUIT STRUCTURE FOR POWER SUPPLY

BACKGROUND OF THE INVENTION

1. Field of the Invention

The present invention relates to a printed circuit board on which a semiconductor such as an IC package is mounted.

2. Description of the Related Art

In recent years, along with realization of high speed operation and high integration in an electronic device, a power ground noise of a semiconductor integrated circuit (IC chip) mounted on a printed wiring board in the electronic device tends to increase. The power ground noise is generated by a sudden variation of the current consumed by the IC chip when the current flows in a power supply wiring of the printed wiring board or a semiconductor package. FIGS. 12A and 12B illustrate a general frequency characteristic of the power ground noise. In FIG. 12A, the abscissa indicates frequency and the ordinate indicates the amount of generated power ground noise. The amount of generated power ground noise in the IC chip increases at plural frequencies which depend on the operating frequency of the IC chip. When the amount of generated power ground noise exceeds a threshold value, a signal transmission timing of the IC chip under operation varies, so a malfunction of the electronic device occurs.

In order to reduce the power ground noise, a method of providing a bypass capacitor between a power supply wiring and a ground (GND) wiring near the IC chip has been generally known. The characteristic of the bypass capacitor also depends on frequency, so the bypass capacitor is not always effective for all frequencies. FIG. 12B illustrates a general characteristic of the bypass capacitor. In FIG. 12B, the abscissa indicates frequency and the ordinate indicates impedance of the bypass capacitor. As is apparent from FIG. 12B, the impedance of the bypass capacitor becomes significantly low at one frequency (resonance frequency). That is, although the power ground noise can be reduced in one frequency (resonance frequency) band, the power ground noise cannot be sufficiently reduced in other frequency bands than such frequency band. That is, the frequency is typically determined based on capacitance of the bypass capacitor and inductance of a supply path up to the bypass capacitor. The resonance frequency of the bypass capacitor can be obtained by the following expression (1).

$$F = \frac{1}{2\pi\sqrt{LC}} \quad (1)$$

That is, with regard to the resonance frequency F, capacitance C of the bypass capacitor and inductance L between the IC chip and the bypass capacitor are changed to shift the resonance frequency, so it is possible to change the frequency band at which an effect of the bypass capacitor can be expected. In other words, when the frequency at which the power ground noise generated from the IC chip is large is set as the resonance frequency of the bypass capacitor, effective power ground noise reduction can be realized.

It has been known that the bypass capacitor located at distance as close as possible from the power supply terminal and the GND terminal of the IC chip effectively acts on the power ground noise. That is, when the inductance of a wiring connecting between the IC chip and the bypass capacitor is reduced, current can be supplied to the IC chip more steeply, so it is possible to reduce the power ground noise. When the propagation path (propagation loop) of a signal which carries the power ground noise is shortened, radiation noise resulting from the power ground noise can be also reduced.

U.S. Pat. No. 6,384,476 discusses a configuration of a bypass capacitor in a printed circuit board on which a ball grid array (BGA) type semiconductor package is mounted. According to U.S. Pat. No. 6,384,476, the power supply terminal and the GND terminal of the semiconductor package are located adjacent to each other. The power supply wiring and the GND wiring are led from the power supply terminal and the GND terminal to the back surface of the printed wiring board through a through hole and connected with each other through the bypass capacitor. Therefore, the physical distance between the IC chip and the bypass capacitor is shortened to reduce inductance of the power supply wiring and inductance of the GND wiring, thereby reducing the power ground noise.

Japanese Patent Application Laid-Open No. H09-139573 discusses a method of reducing the power ground noise using an LC filter which includes a bypass capacitor and an inductor which are provided in an IC package. The bypass capacitor is located in the IC package, so the distance between the IC chip and the bypass capacitor is further shortened.

Japanese Patent Application Laid-Open No. 2003-318352 discusses that voltage conversion is performed by a step-down circuit of an IC package to obtain a core power source and the core power is supplied to an IC chip of the IC package. In this case, a core voltage terminal is provided for the IC package, and the core power source is stabilized by a bypass capacitor on a printed wiring board.

As discussed in U.S. Pat. No. 6,384,476 and Japanese Patent Application Laid-Open Nos. H09-139573 and 2003-318352, when the bypass capacitor is used, the power ground noise corresponding to the operating frequency of the IC chip can be reduced. However, the power ground noise generated in an inner portion of the IC chip causes not only a malfunction due to a variation in timing of the IC chip under operation and the like but also a malfunction of another IC chip and the generation of an EMI noise in the case where the power ground noise propagates to the power supply side. In particular, it is difficult to predict the EMI noise in the design phase, so the reduction thereof is a serious problem.

Here, a problem with respect to the propagation of the power ground noise to another IC chip in a circuit using a normal bypass capacitor will be described with reference to a result obtained by simulation.

FIG. 13 illustrates a circuit model in which bypass capacitors are provided. Calculation was performed through a simulation using the circuit model. A source power supply 201 and an IC chip 211 are assumed. The purpose of this simulation is to evaluate the characteristic of the power supply path between the source power supply and the IC chip, so the source power supply and the IC chip are assumed as an input or output of the power supply path and are thus not modeled.

The power supply path between the source power supply 201 and the IC chip 211 is modeled with power supply paths 202a, 202b, and 202c. It is assumed that the power supply path 202a is a line whose width is 50 mm and length is 50 mm, L=4.9e-09 H/cm, C=9.5454e-09 F/cm, R(DC)=0.011 Ω/cm, Rs=4.01609262841384e-06 (Ω·ns) 0.5/cm, and Gd=1.718589e-10 mS/cm. It is assumed that the power supply path 202b is a line whose width is 8 mm and length is 3 mm, L=2.15e-08 H/cm, C=2.1492e-09 F/cm, R(DC)=0.066 Ω/cm, Rs=2.36854596746612e-05 (Ω·ns) 0.5/cm, and Gd=3.86858e-11 mS/cm. Ts is assumed that the power supply path 202c is a line whose width is 8 mm and length is 20 mm, L=2.15e-08 H/cm, C=2.1492e-09 F/cm, R(DC)=0.066 Ω/cm, Rs=2.36854596746612e-05 (Ω·ns) 0.5/cm, and Gd=3.86858e-11 mS/cm. Note that Rs represents a resistance component obtained due to a skin effect, and Gd represents a parameter for dielectric loss.

The GND wiring path between the IC chip 211 and the source power supply 201 is modeled with GND paths 203a, 203b, and 203c. Each of the GND paths 203a, 203b, and 203c has a characteristic approximated by 0. A low-frequency bypass capacitor 221 is provided between the connection point located between the power supply paths 202a and 202b and the connection point located between the GND paths 203a and 203b. The capacitance of the bypass capacitor 221 is set to 0.1 pF (parasitic inductance 0.5 nH×2). A high-frequency bypass capacitor 222 is provided between the connection point located between the power supply paths 202b and 202c and the connection point located between the GND paths 203b and 203c. The capacitance of the bypass capacitor 222 is set to 1000 pF (parasitic inductance 0.5 nH×2) obtained by the following expression (2).

FIG. 14A illustrates a Z11 (impedance) characteristic in the case where the circuit model of FIG. 13 is observed from the IC chip 211. As the value of the Z11 characteristic is decreased, the power supply for the IC chip is stabilized at the frequency thereof, so the IC chip has a high resistance to the power ground noise. In FIG. 14A, the resonance point of a low impedance in the vicinity of 10 MHz may be caused by the bypass capacitor 221, and the resonance point of a low impedance in the vicinity of 100 MHz may be caused by the bypass capacitor 222. The resonance point at a higher frequency may be caused by a characteristic of the entire power supply including the power supply paths 202a, 202b, and 202c. That is, the power ground noise in the vicinity of 10 MHz can be reduced by the bypass capacitor 221 and the power ground noise in the vicinity of 100 MHz can be reduced by the bypass capacitor 222.

FIG. 14B illustrates an S21 (transmission) characteristic from the IC chip 211 to the power supply 201 in the circuit model of FIG. 13. The S21 characteristic will be described with reference to FIGS. 15A and 15B. In FIG. 15A, a four-terminal circuit 300 to be measured includes an input side power supply terminal 301a, an input side GND terminal 302a, an output side GND terminal 301b, and an output side power supply terminal 302b. An IC chip 320 is distinct from the IC chip 211, to which power is supplied from the source power supply 201. The S21 characteristic of the four-terminal circuit network when observed from the input side power supply terminal 301a and the input side GND terminal 302a is the signal propagation characteristic at each frequency, to the output side power supply terminal 301b and the output side GND terminal 302b. Therefore, the S21 characteristic exhibits that, as the value thereof is reduced, the power ground noise generated in the IC chip is hard to propagate to the power supply side. That is, it is possible to reduce the influence of the power ground noise on another IC chip (IC 320 in FIG. 15B), to which a voltage of the same potential is supplied from the source power supply 201, which also supplies the voltage to the IC chip 211.

The S21 characteristic from the IC chip 211 to the power supply 201 in the circuit model of FIG. 13 is a transmission characteristic from the input side power supply terminal 301a to the output side power supply terminal 301b through the four-terminal circuit 300 in FIG. 15A.

In FIG. 14B, the point at which the S21 characteristic is high in the vicinity of 10 MHz may be caused by the influence of the bypass capacitor 221, and the point at which the S21 characteristic is high in the vicinity of 100 MHz may be caused by the influence of the bypass capacitor 222. The resonance point at a higher frequency may be caused by the characteristic of the entire power supply including the power supply paths 202a, 202b, and 202c. That is, the power ground noise at frequencies close to 10 MHz and 100 MHz are liable to be propagated to the outside through the power supply of the IC chip by the bypass capacitors 221 and 222.

FIG. 14C is an enlarged portion, in the frequency range (100 MHz to 200 MHz) which is close to the resonance point of the bypass capacitor 222, of a graph illustrating that the Z11 characteristic of FIG. 14A is superimposed on the S21 characteristic of FIG. 14B in the case of the circuit structure of FIG. 13. As is apparent from the Z11 characteristic of FIG. 14C, the resonance point at which the bypass capacitor 222 acts most effectively is within a frequency band close to 138 MHz. In contrast, the frequency band in which the S21 characteristic deteriorates is close to 147 MHz. Therefore, when the resonance frequency of the bypass capacitor 222 is adjusted to a frequency at which the power ground noise is maximum (138 MHz), the impedance of the IC chip at the resonance frequency reduces to reduce the power ground noise. However, the resonance frequency is significantly close to the frequency band in which the S21 characteristic deteriorates, so the power ground noise propagated to the outside becomes larger.

As a result of concentrated studies, the inventor(s) of the present invention found that the frequency band of the bypass capacitor in which the S21 characteristic deteriorates is always present close to the resonance point in the Z11 characteristic. This may be because, in FIG. 13, when the power ground noise at the frequency close to the resonance point of the bypass capacitor 222 will actively flow toward the bypass capacitor 22 at the connection point located between the power supply paths 202b and 202c for supply, a part of the power ground noise is leaked from the connection located between the power supply paths 202b and 202c for supply to the power supply side in a case where the flow toward the bypass capacitor 222 is strong.

Therefore, in the case of the circuit structure using the bypass capacitor as discussed in U.S. Pat. No. 6,384,476 and Japanese Patent Application Laid-Open Nos. H09-139573 and 2003-318352, the power ground noise propagated from the IC chip to the power supply side becomes larger in the frequency band close to the resonance frequency of the bypass capacitor.

(Second Problem)

In addition, in the case of the circuit structure using the bypass capacitor as discussed in U.S. Pat. No. 6,384,476 and Japanese Patent Application Laid-Open Nos. H09-139573 and 2003-318352, it was difficult to accurately determine the resonance frequency of the bypass capacitor. That is, in order to determine the resonance frequency, it was necessary to model all complicated power supply paths to perform a simulation.

In order to exhibit the fact that it is difficult to accurately determine the resonance frequency of the bypass capacitor, calculation was performed by a simulation using a circuit model illustrated in FIG. 16. The circuit model illustrated in FIG. 16 includes the IC chip 211 and the bypass capacitor 222 which have the same characteristics as those in the circuit model of FIG. 13 and are connected with each other through a power supply path 112a and a GND path 113a.

FIG. 17 illustrates a Z11 (impedance) characteristic in a case where the circuit model of FIG. 16 is observed from the IC chip 211. In FIG. 17, the resonance point of a low impedance in the vicinity of 100 MHz is caused by the bypass capacitor 222.

FIG. 18 illustrates enlarged portions of the graphs of FIGS. 14A and 17 in the vicinity of the resonance frequency (vicinity of 100 MHz) of the bypass capacitor 222. The resonance frequency in the graph of FIG. 14A is approximately 138 MHz, and the resonance frequency in the graph of FIG. 17 is approximately 132 MHz. That is, the resonance frequency (approximately 133 MHz) of the bypass capacitor 222 which corresponds to the characteristic thereof is shifted to approximately 138 MHz by the influence of the power supply paths 202a and 203a and the bypass capacitor 221. Therefore, when the complicated influence of another path and another electronic part are not taken into account, the resonance point of the bypass capacitor 222 cannot be accurately determined in a normal condition.

In addition, in the case of the circuit structure using the bypass capacitor as discussed in U.S. Pat. No. 6,384,476 and Japanese Patent Application Laid-Open Nos. H09-139573 and 2003-318352, when the characteristic of the bypass capacitor is changed, the characteristic of a bypass capacitor in another circuit which is electrically connected with the circuit structure is influenced by the changed characteristic. Therefore, when the characteristic of the bypass capacitor is adjusted based on a frequency at which the power ground noise is large after the completion of a printed wiring board, it is liable to vary the resonance frequency of the bypass capacitor of the electrically connected circuit, thereby increasing the noise at a frequency independent of the resonance frequency of the bypass capacitor.

FIG. 19 illustrates a circuit model obtained by omitting the bypass capacitor 222 from the circuit model of FIG. 13. FIG. 20 illustrates an S21 characteristic from the IC chip 211 to the power supply 201 in the circuit model of FIG. 19. The S21 characteristic of the circuit model of FIG. 13 is superimposed for comparison. As is apparent from FIG. 20, when the bypass capacitor 222 is attached to the circuit model of FIG. 13, the resonance frequency close to 1 GHz changes.

FIG. 21 is an enlarged portion of the graph of FIG. 20 in a range of 700 MHz to 1 GHz. As is apparent from FIG. 21, the resonance frequency in the circuit model of FIG. 13 is approximately 910 MHz. In contrast, the resonance frequency in the circuit model of FIG. 19 from which the bypass capacitor 222 is removed is approximately 870 MHz. That is, when the bypass capacitor 222 is attached, the resonance frequency close to 900 MHz changes.

SUMMARY OF THE INVENTION

The present invention has been made in view of the above-mentioned circumstances. An object of the present invention is to inhibit a power ground noise from causing not only a variation in timing of an IC chip and a malfunction thereof but also a malfunction of another IC chip and the generation of an EMI noise in the case where the power ground noise propagates to a power supply side. Another object of the present invention is to accurately determine a resonance frequency of a bypass capacitor to more effectively reduce the power ground noise.

The present invention provides a printed circuit board, in which a semiconductor including plural power supply terminals and a semiconductor chip is mounted on a mount surface of a printed wiring board.

The printed circuit board includes: a first circuit for supplying power to the semiconductor chip, the first circuit comprising: a first power supply wiring for connecting a first power supply terminal of the semiconductor with a source power supply; a first ground wiring for connecting a first ground terminal of the semiconductor with the source power supply; and a first bypass capacitor connecting the first power supply wiring and the first ground wiring; and a second circuit comprising: a second power supply wiring connected to a second power supply terminal of the semiconductor; a second ground wiring connected to a second ground terminal of the semiconductor; and a second bypass capacitor connecting the second power supply wiring and the second ground wiring, in which:

the first power supply terminal and the second power supply terminal are at the same potential; the first power supply terminal is electrically connected with the second power supply terminal only within the semiconductor chip; and the first ground wiring is electrically connected with the second ground wiring only within the semiconductor chip.

Further features of the present invention will become apparent from the following description of exemplary embodiments with reference to the attached drawings.

DESCRIPTION OF THE EMBODIMENTS

An exemplary embodiment for embodying the present invention will be described with reference to the attached drawings.

Embodiment 1

Figure 1A:
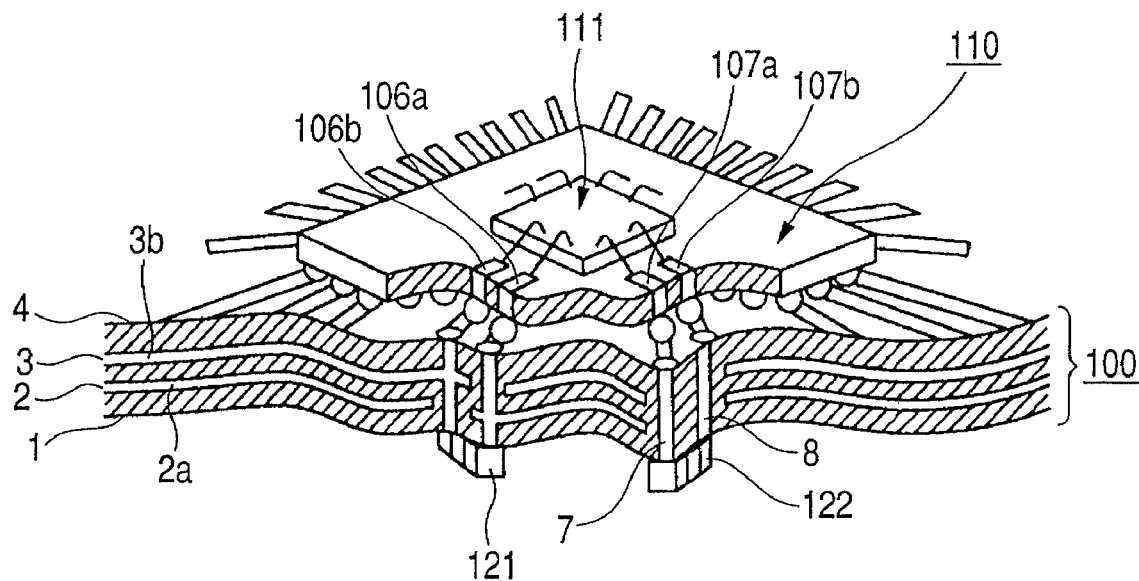
FIGS. 1A and 1B are a perspective view and a cross sectional view, illustrating a printed circuit board according to Embodiment 1 of the present invention.
Figure 1B:
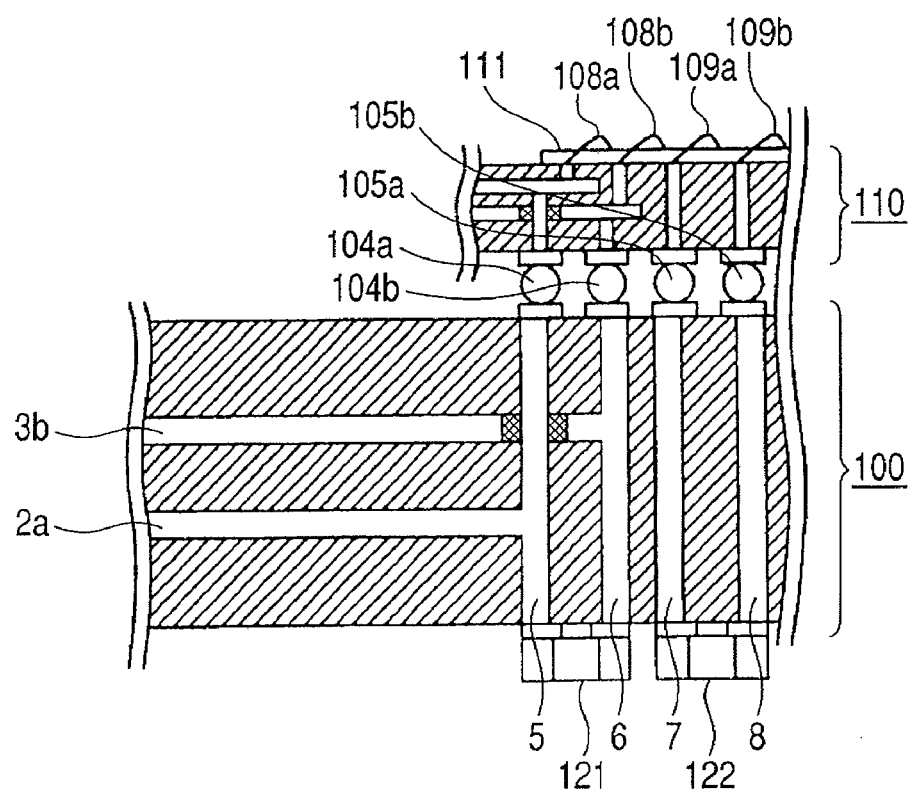

FIGS. 1A and 1B illustrate a printed circuit board according to Embodiment 1 of the present invention. FIG. 1A is a perspective view illustrating the printed circuit board which is partially cut away to facilitate the understanding of the present invention. FIG. 1B is a cross sectional view illustrating the printed circuit board of FIG. 1A.

A printed wiring board 100 includes circuits formed therein. An IC package 110 having a BGA structure is mounted on the printed wiring board 100. The IC package 110 is provided with an IC chip 111. Although the IC chip 111 located on the IC package 110 is normally molded with a resin, the resin is omitted here.

The printed wiring board 100 has a four-layer structure and includes a back surface signal wiring layer 1, a power supply layer 2, a ground (GND) layer 3, and a front surface signal wiring 4. The power supply layer 2 and the GND layer 3 are connected to a source power supply 101 (not shown here). A power supply terminal 104a of the IC package 110 is connected to a supply-side power supply wiring 2a of the power supply layer 2 through a through hole 5. A GND terminal 104b of the IC package 110 is connected to a supply-side GND wiring 3b of the GND layer 3 through a through hole 6. The through hole 5 and the through hole 6 are connected to each other by a bypass capacitor 121 in the back surface signal wiring 1.

A power supply terminal 105a of the IC package 110 which is different from the power supply terminal 104a is connected to a through hole 7. A GND terminal 105b of the IC package 110 which is different from the GND terminal 104b is connected to a through hole 8. The power supply terminal 105a and the GND terminal 105b are connected with each other by a bypass capacitor 122 in the back surface signal wiring 1 through the through hole 7 and the through hole 8. At this time, the through hole 7 and the through hole 8 are not connected to the supply-side power supply wiring 2a and the supply-side GND wiring 3b. That is, the bypass capacitor 122 is separated from the supply-side power supply wiring 2a and the supply-side GND wiring 3b.

The bypass capacitor 121 and the bypass capacitor 122 have different capacitances and the resonance frequencies thereof are in different frequency bands. The capacitance of the bypass capacitor 121 is made larger than the capacitance of the bypass capacitor 122 to reduce power ground noise in a relatively low frequency band. The bypass capacitor 122 is used to reduce power ground noise in a relatively high frequency band.

FIG. 1B is a cross sectional view of FIG. 1A. To facilitate the understanding of the present invention, however, the power supply terminal 104a, the GND terminal 104b, the power supply terminal 105a, and the GND terminal 105b are illustrated so as to locate adjacent to one another. Therefore, the through holes 5, 6, 7, and 8 are also illustrated so as to locate adjacent to one another.

Within the IC package 110, the power supply terminal 104a is connected to the IC chip 111 through a power supply wiring 106a and a bonding wire 108a. The GND terminal 104b is connected to the IC chip 111 through a power supply wiring 106b and a bonding wire 108b. The power supply terminal 105a is connected to the IC chip 111 through a power supply wiring 107a and a bonding wire 109a. The GND terminal 105b is connected to the IC chip 111 through a power supply wiring 107b and a bonding wire 109b. The power supply terminal 104a is electrically connected to the power supply terminal 105a within the IC chip 111, so they are at the same potential. The GND terminal 104b is electrically connected to the GND terminal 105b within the IC chip 111.

Figure 2:
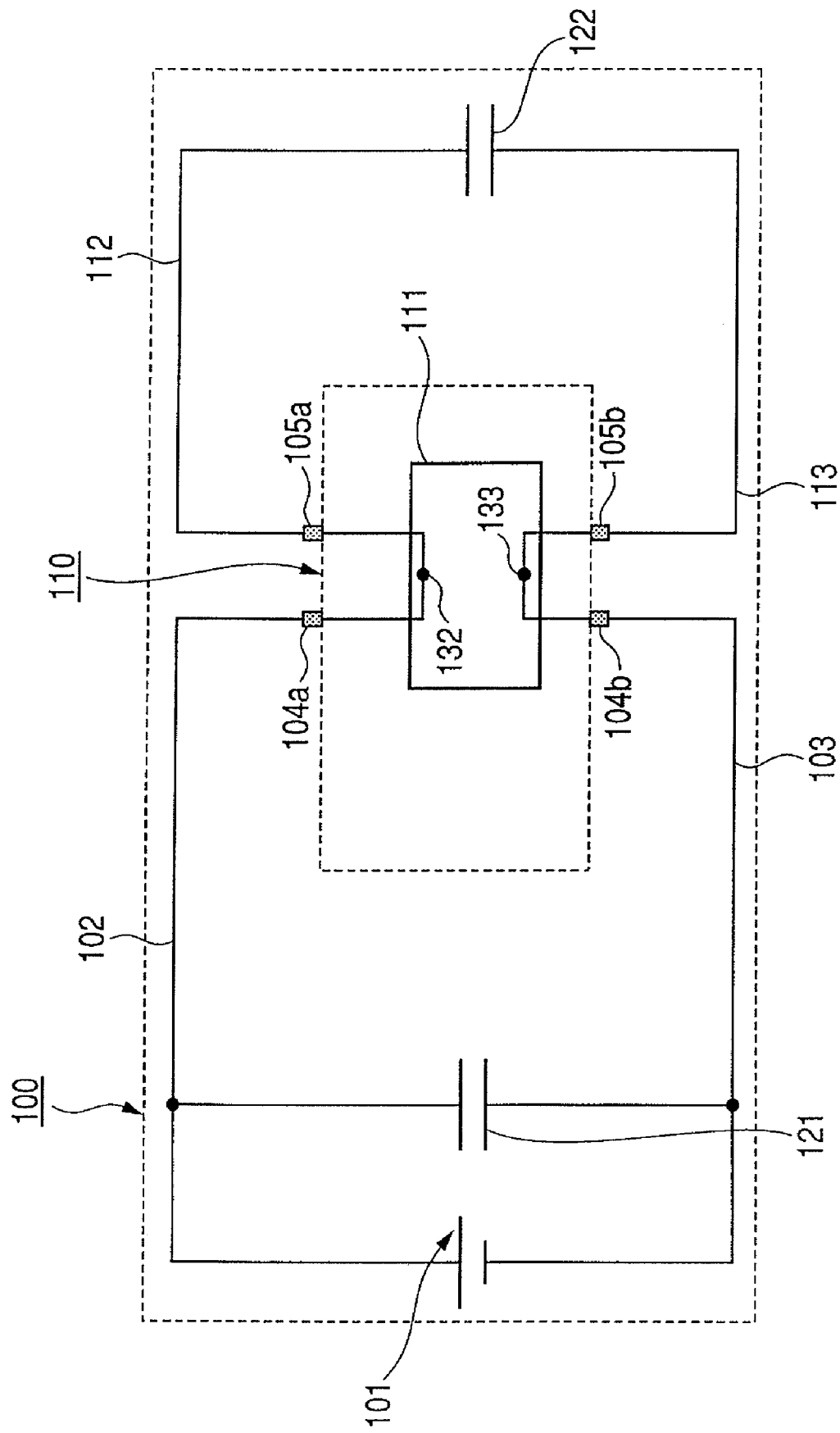
FIG. 2 is a schematic diagram illustrating a circuit structure of the printed circuit board according to Embodiment 1 of the present invention.

FIG. 2 is a schematic diagram illustrating a circuit structure of the printed circuit board of FIGS. 1A and 1B according to the present invention. In FIG. 2, the same members as those of FIGS. 1A and 1B are expressed by the same symbols. As illustrated in FIG. 2, power is supplied from the source power supply 101 to the IC chip 111 of the IC package 110 such as a semiconductor through a power supply path 102 for supply. The power supply path 102 for supply is connected to the power supply terminal 104a of the IC package 110. A ground (GND) terminal of the IC chip 111 is connected to the source power supply 101 through a GND path 103 for supply. The GND path 103 for supply is connected with the power supply terminal 104b of the IC package 110. The bypass capacitor 121 for reducing the power ground noise is provided between the power supply path 102 for supply and the GND path 103 for supply. A first circuit comprise the source power supply 101, the power supply path 102 for supply, the GND path 103 for supply, and the bypass capacitor 121.

The power supply terminal 105a different from the power supply terminal 104a and the GND terminal 105b different from the GND terminal 104b are provided in the IC package 110. The power supply terminal 105a is connected to the bypass capacitor 122 through a power supply path 112 for bypass capacitor. The GND terminal 105b is connected to the bypass capacitor 122 through a GND path 113 for bypass capacitor. A second circuit comprises the power supply path 112 for bypass capacitor, the GND path 113 for bypass capacitor, and the bypass capacitor 122.

The power supply path 102 for supply and the power supply path 112 for bypass capacitor are connected to each other at a connection point 132 within the IC chip 111 and thus are at the same potential. In addition, the GND path 103 for supply and the GND path 113 for bypass capacitor are connected to each other at a connection point 133 within the IC chip 111.

(Circuit Structure)

EXAMPLE 1

Figure 3:
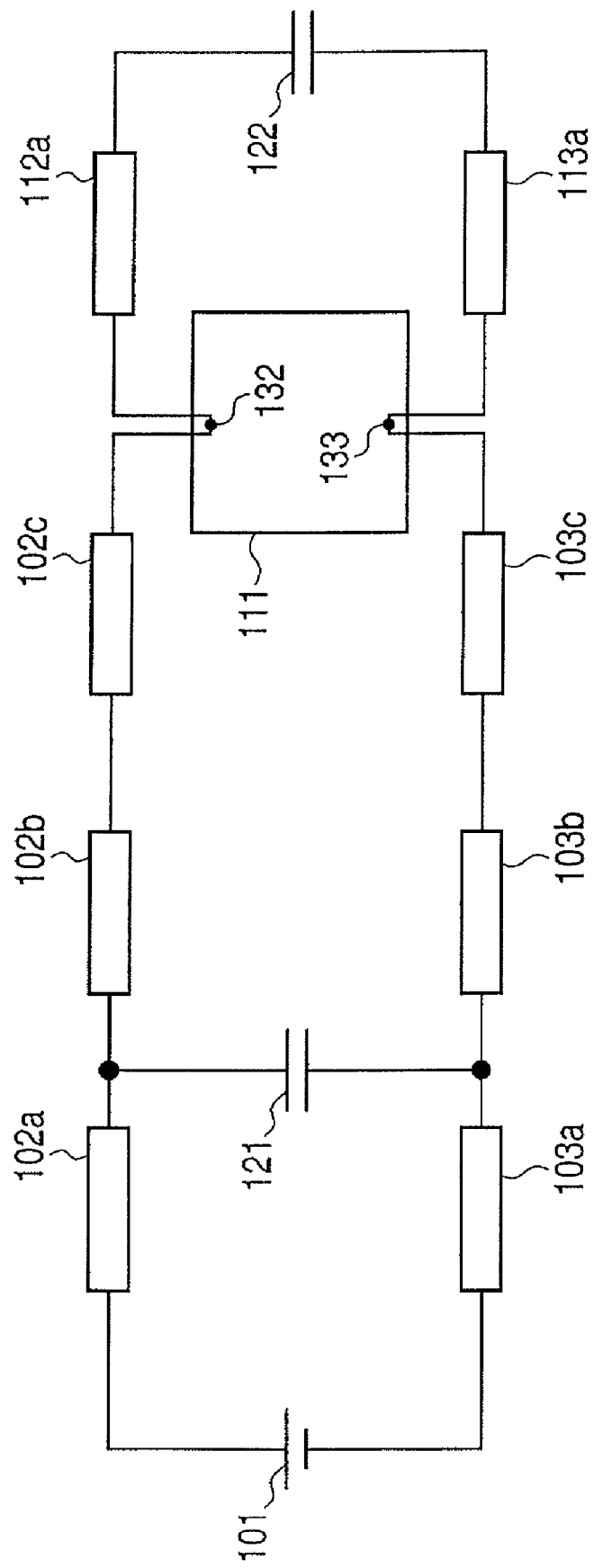
FIG. 3 illustrates a circuit model for simulation performed in Embodiment 1 of the present invention.

In order to examine an effect of the circuit structure illustrated in FIG. 2, a simulation is performed. FIG. 3 is a circuit diagram illustrating a circuit structure for simulation. The first circuit located on the power supply side of the IC chip 111 is modeled using the source power supply 101, supply-side power supply paths 102a, 102b, and 102c, supply-side GND paths 103a, 103b, and 103c, and the bypass capacitor 121.

The source power supply 101 is a source power supply. Reference numeral 111 denotes an IC chip. The purpose of this simulation is to evaluate the characteristic of the power supply path between the source power supply 101 and the IC chip 111, so the source power supply and the IC chip are assumed as an input or output of the power supply path and thus not modeled. It is assumed that the power supply path 102a is a line whose width is 50 mm and length is 50 mm, L=4.9e-09 H/cm, C=9.5454e-09 F/cm, R(DC)=0.011 Ω/cm, Rs=4.01609262841384e-06 (Ω·ns) 0.5/cm, and Gd=1.718589e-10 mS/cm. It is assumed that the power supply path 102b is a line whose width is 8 mm and length is 3 mm, L=2.15e-08 H/cm, C=2.1492e-09 F/cm, R(DC)=0.066 Ω/cm, Rs=2.36854596746612e-05 (Ω·ns) 0.5/cm, and Gd=3.86858e-11 mS/cm. It is assumed that the power supply path 102c is a line whose width is 8 mm and length is 20 mm, L=2.15e-08 H/cm, C=2.1492e-09 F/cm, R(DC)=0.066 Ω/cm, Rs=2.36854596746612e-05 (Ω·ns) 0.5/cm, and Gd=3.86858e-11 mS/cm. Note that Rs represents a resistance component obtained due to a skin effect, and Gd represents a parameter for dielectric loss.

The GND wiring between the IC chip 111 and the source power supply 101 is modeled as the GND paths 103a, 103b, and 103c. Each of the GND paths 103a, 103b, and 103c has a characteristic approximated by 0. The low-frequency bypass capacitor 121 is provided between the connection point located between the power supply paths 102a and 102b and the connection point located between the GND paths 103a and 103b. The capacitance of the bypass capacitor 121 is set to 0.1 uF (parasitic inductance 0.5 nH×2).

The second circuit comprises the bypass capacitor 122, a power supply path 112a for bypass capacitor, and a GND path 113a for bypass capacitor. It is assumed that the power supply path 112a is a line whose width is 8 mm and length is 20 mm, L=2.15e-08 H/cm, C=2.1492e-09 F/cm, R(DC)=0.066 Ω/cm, Rs=2.36854596746612e-05 (Ω·ns) 0.5/cm, and Gd=3.86858e-11 mS/cm. The GND path 113a has a characteristic approximated by 0. The capacitance of the bypass capacitor 122 is set to 1000 pF (parasitic inductance 0.5 nH×2).

The power supply path 102c for supply and the power supply path 112a for bypass capacitor are connected to each other at the connection point 132 within the IC chip 111 and thus are at the same potential. In addition, the GND path 103c for supply and the GND path 113a for bypass capacitor are connected to each other at the connection point 133 within the IC chip 111.

Figure 4A:
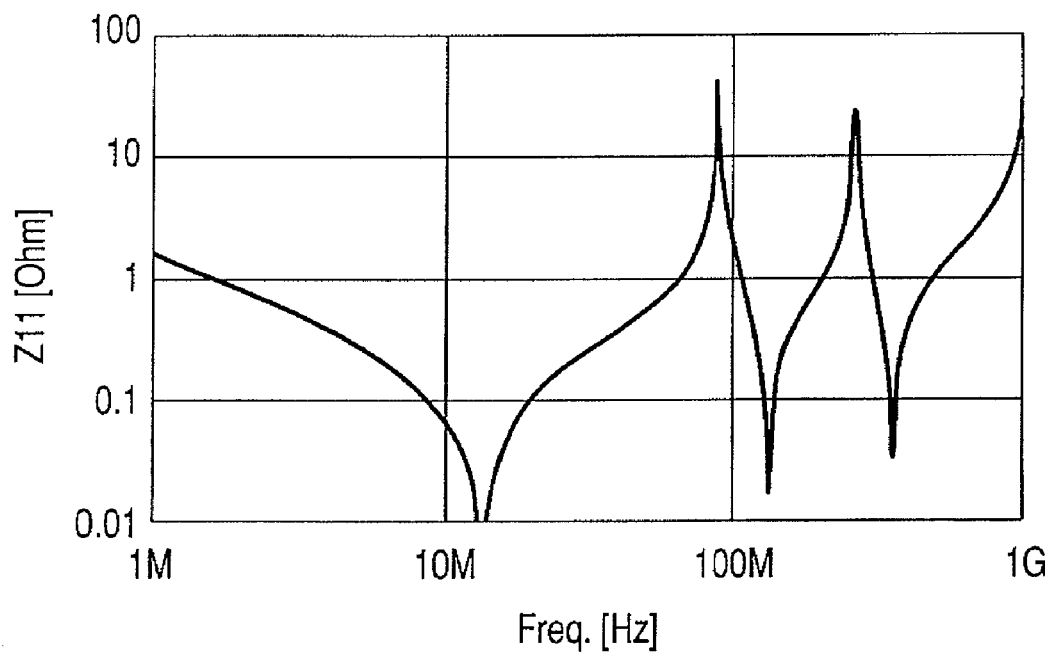
FIGS. 4A, 4B, and 4C are graphs illustrating characteristics of the circuit model of FIG. 3.

FIG. 4A illustrates a Z11 characteristic of the circuit structure of FIG. 2 as observed from the IC chip 111 at respective frequencies. In FIG. 4A, the resonance point of a low impedance in the vicinity of 10 MHz may be caused by the bypass capacitor 121 and the resonance point of a low impedance in the vicinity of 100 MHz may be caused by the bypass capacitor 122. The resonance point at higher frequencies may be caused by the characteristic of the entire power supply including the power supply paths 102a, 102b, and 102c. That is, the power ground noise in the vicinity of 10 MHz can be reduced by the bypass capacitor 121 and the power ground noise in the vicinity of 100 MHz can be reduced by the bypass capacitor 122.

Figure 4B:
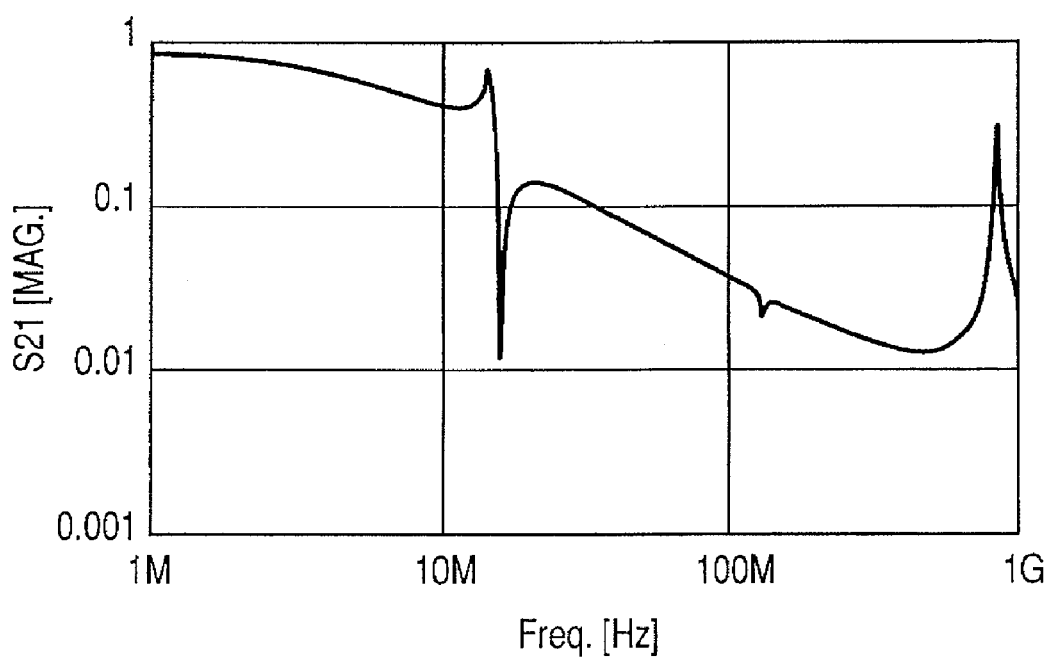

FIG. 4B illustrates an S21 characteristic from the IC chip 111 to the power supply 101. In FIG. 4B, the point at which the S21 characteristic is high in the vicinity of 10 MHz may be caused by the bypass capacitor 121. In the vicinity of 100 MHz, there is no point at which the S21 characteristic is high. The resonance point at higher frequencies may be caused by the characteristic of the entire power supply including the power supply paths 102a, 102b, and 102c. That is, the power ground noise at frequencies close to 10 MHz is likely to be propagated to the outside of the IC chip by the bypass capacitor 121. In contrast, the power ground noise at frequencies close to 100 MHz almost does not propagate to the outside of the IC chip.

Figure 4C:
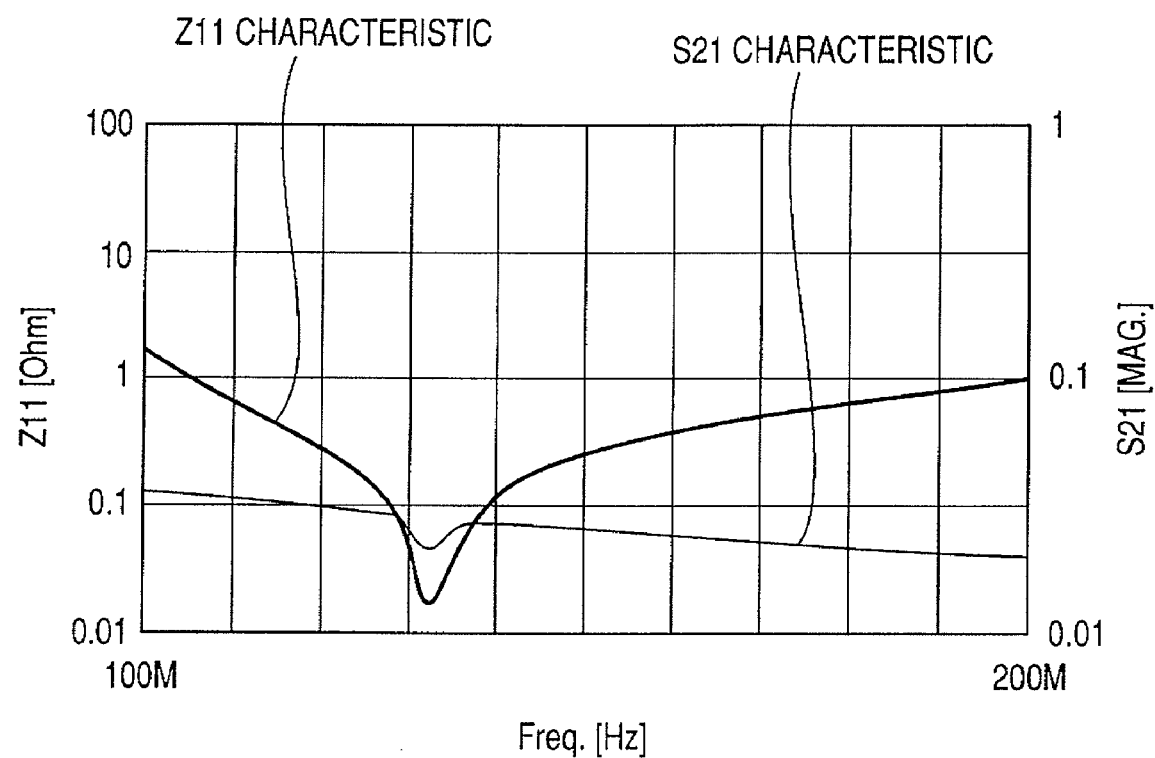
Figure 14A:
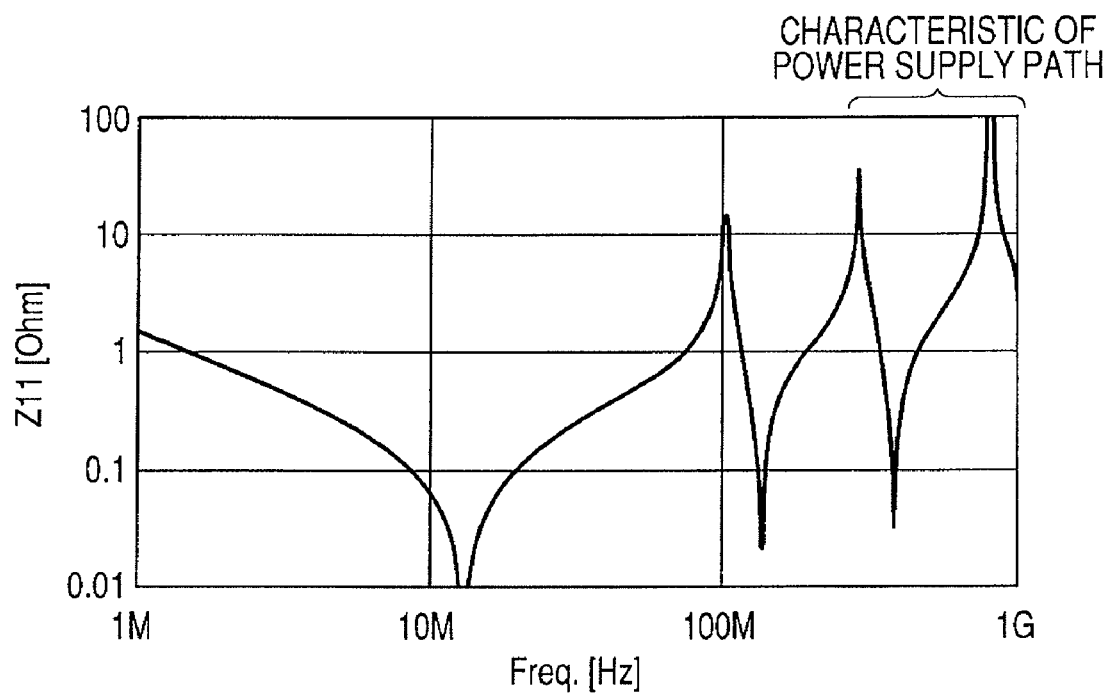
FIGS. 14A, 14B, and 14C are graphs illustrating Z-characteristics of the circuit model of FIG. 13.
Figure 14B:
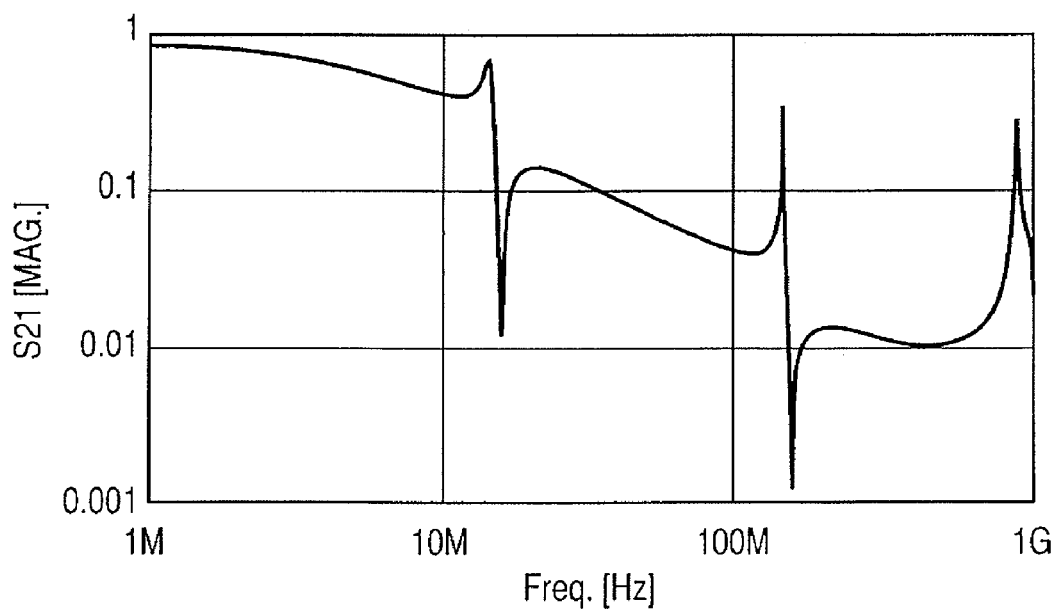
Figure 14C:
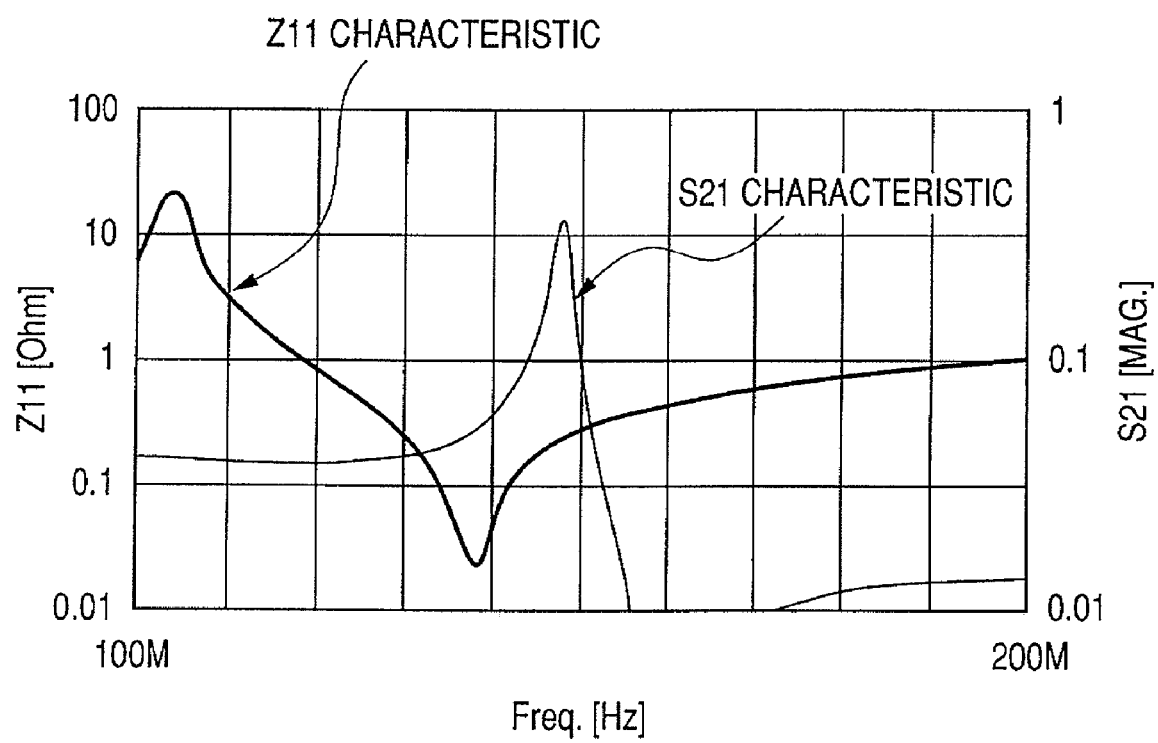
Figure 15A:
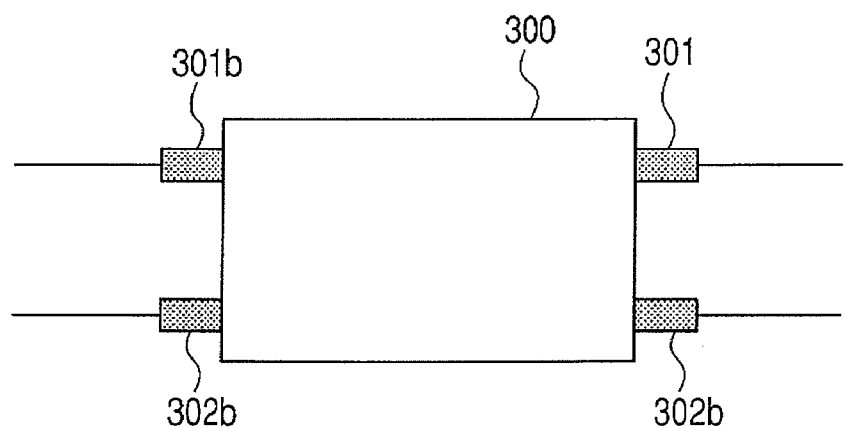
FIGS. 15A and 15B are schematic explanatory diagrams illustrating an S21 characteristic of the circuit model of FIG. 13.
Figure 15B:
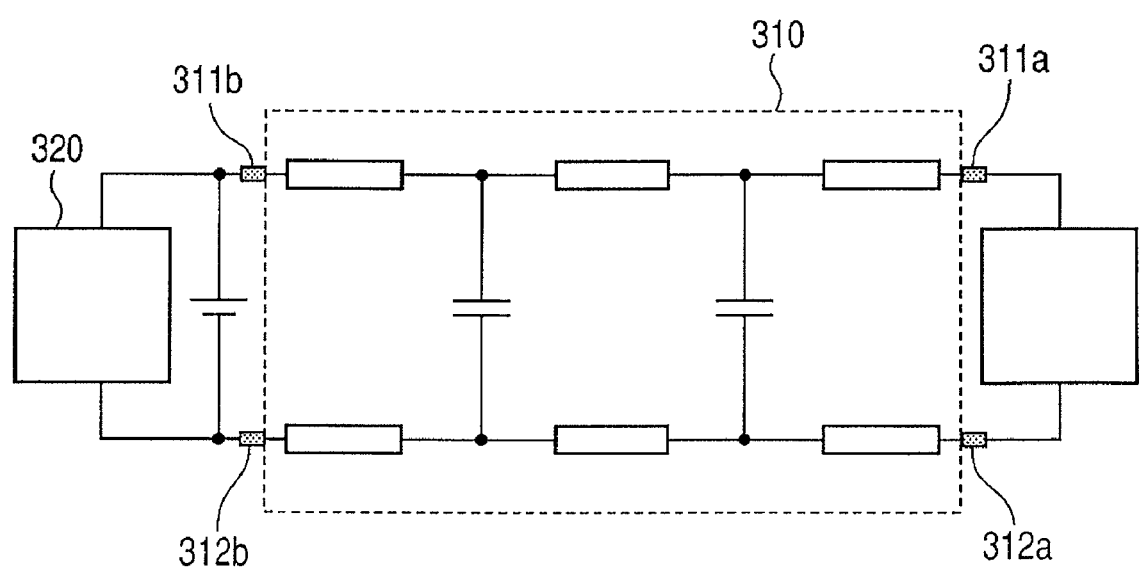

FIG. 4C is an enlarged portion, in a frequency range of 100 MHz to 200 MHz which is close to the resonance point of the bypass capacitor 122, of a graph illustrating that the Z11 characteristic of FIG. 4A is superimposed on the S21 characteristic of FIG. 4B. As is apparent from the comparison between the graph of FIG. 4C and the graph of FIG. 14C illustrating the Z11 characteristic and the S21 characteristic in the conventional circuit structure, the S21 characteristic of FIG. 4C does not deteriorate in the vicinity of the resonance frequency (132 MHz) at which the bypass capacitor 122 acts most effectively. Therefore, when the resonance frequency of the bypass capacitor 122 is adjusted to a frequency at which the power ground noise is maximum, the power ground noise corresponding to the operating frequency of the IC chip can be reduced to prevent the power ground noise from being propagated to the power supply side.

This is achieved by the fact that the second circuit for the bypass capacitor 122 and the first circuit located on the source power supply 101 side are not connected with each other on the IC package 110 and the printed wiring board 100. That is, the second circuit and the first circuit are connected to each other only on the path within the IC chip 111. In such a structure, the power ground noise at a frequency close to the resonance frequency of the bypass capacitor 122 will actively flow toward the bypass capacitor 122 at the connection point 132 located between the power supply paths 102C and 112a for supply. Therefore, it is considered that a part of the power ground noise is not leaked to the power supply side.

The circuit structure according to this embodiment has such an advantage that the resonance frequency of the bypass capacitor 122 is easily determined. That is, the resonance frequency can be determined with high precision by only taking the independent power supply path up to each bypass capacitor into account.

Figure 5:
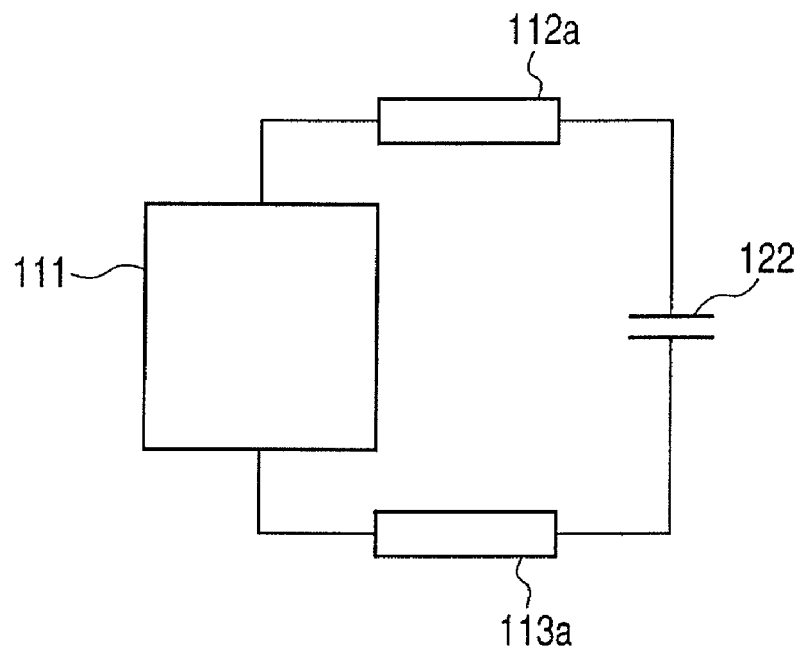
FIG. 5 illustrates a circuit model for comparison simulation in Embodiment 1 of the present invention.

In order to exhibit the fact that the resonance frequency of the bypass capacitor can be determined with high precision by the circuit structure according to this embodiment, calculation is performed by a simulation using a circuit model illustrated in FIG. 5. The circuit model illustrated in FIG. 5 includes the IC chip 111 and the bypass capacitor 122 which have the same characteristics as the characteristics of the circuit model of FIG. 3 and are connected with each other through the power supply path 112a and the GND path 113a.

Figure 6:
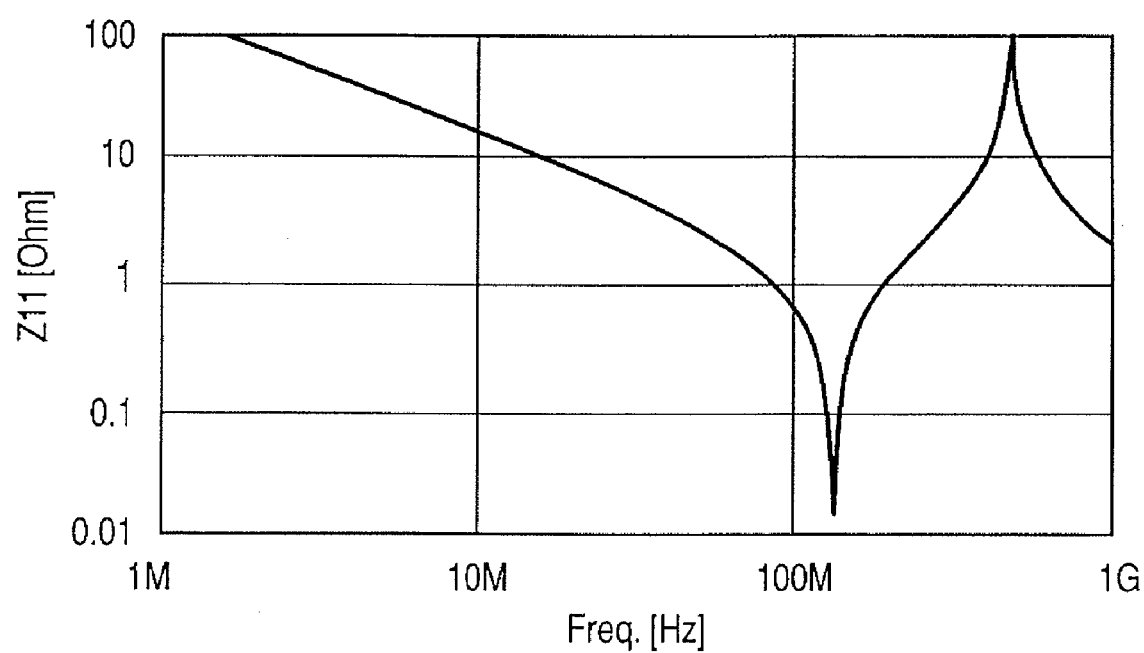
FIG. 6 is a graph illustrating a Z11 characteristic of the circuit model of FIG. 5.

FIG. 6 illustrates a Z11 (impedance) characteristic in the case where the circuit model of FIG. 5 is observed from the IC chip 111. In FIG. 6, the resonance frequency of a low impedance in the vicinity of 100 MHz is caused by the bypass capacitor 122.

Figure 7:
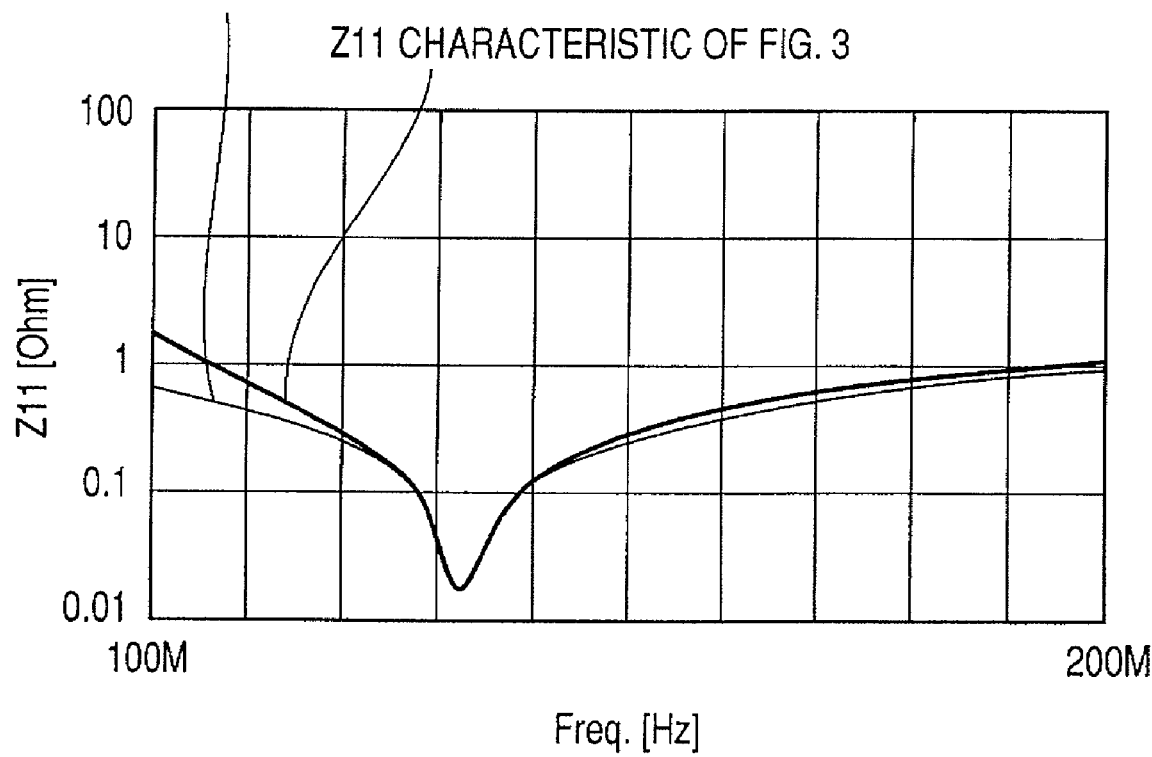
FIG. 7 is a partially enlarged graph illustrating the Z11 characteristic of the circuit model of FIG. 5.

FIG. 7 illustrates enlarged portions of the graphs of FIGS. 4A and 6 in the vicinity of the resonance frequency (100 MHz to 200 MHz) of the bypass capacitor 122. The resonance frequency in the graph of FIG. 4A and the resonance frequency in the graph of FIG. 6 each are approximately 132 MHz and thus substantially equal to each other. That is, even when the complex influence of the bypass capacitor 122 located on the power supply side is not taken into account, the resonance point can be easily determined only in view of the influence of the bypass capacitor 122, the IC chip 111, and the power supply path 112a for bypass capacitor.

According to the circuit structure in this embodiment, even when the characteristic of the bypass capacitor is adjusted corresponding to the frequency at which the noise is large after the completion of the printed wiring board, the resonance frequency of the power supply path for another bypass capacitor is not influenced. Therefore, the power ground noise does not increase at a frequency independent of the resonance frequency of the bypass capacitor.

Figure 8:
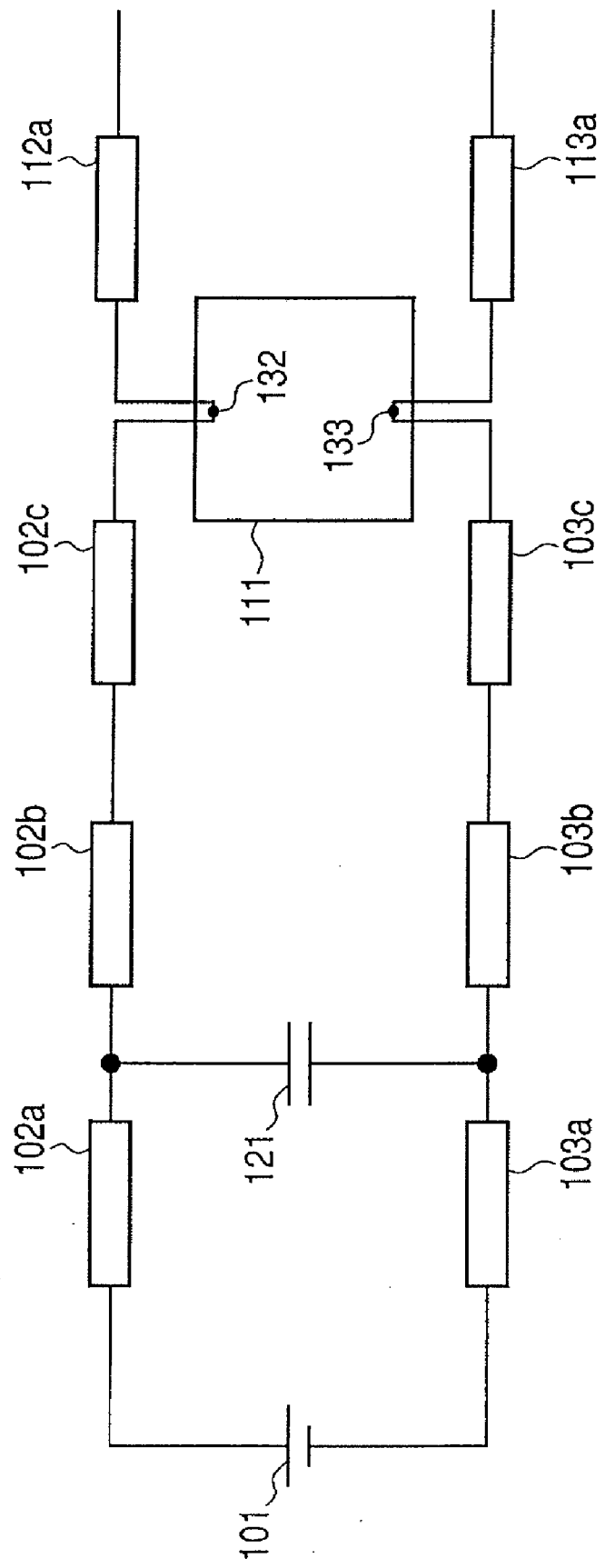
FIG. 8 illustrates a circuit model for comparison simulation in Embodiment 1 of the present invention.

In order to exhibit the fact that the resonance frequency of the power supply path for another bypass capacitor is not influenced by the circuit structure according to this embodiment, calculation is performed by a simulation using a circuit model illustrated in FIG. 8. The circuit model illustrated in FIG. 8 corresponds to a circuit model obtained by omitting the bypass capacitor 122 from the circuit model of FIG. 3.

Figure 9:
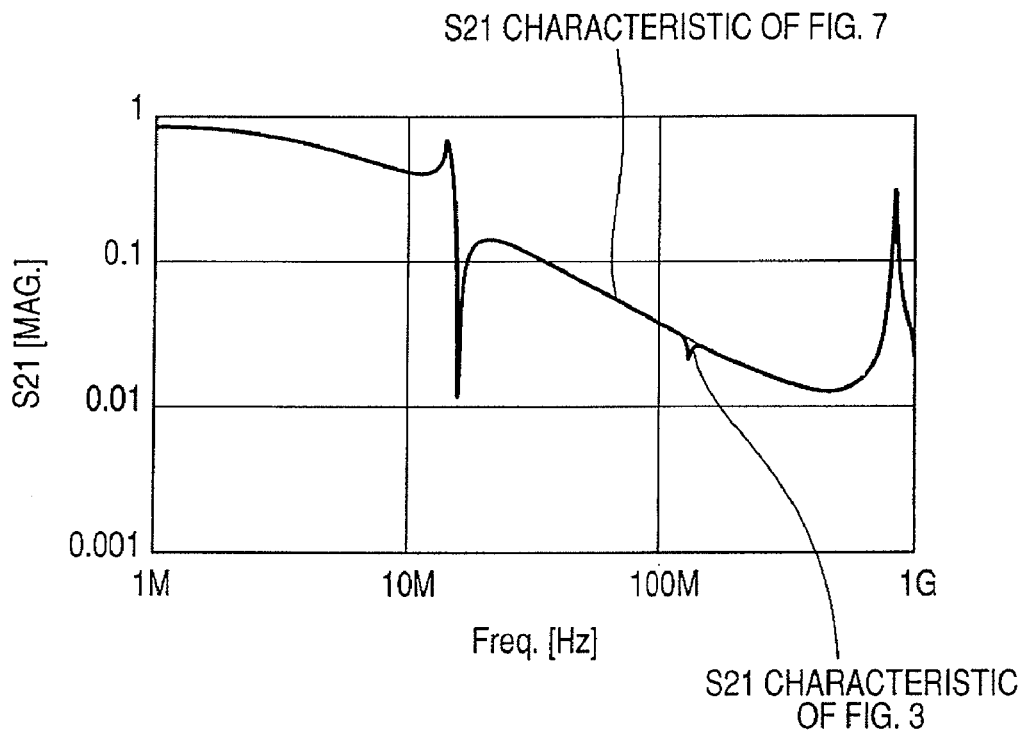
FIG. 9 is a graph illustrating an S21 characteristic of the circuit model of FIGS. 4A, 4B, and 4C.
Figure 10:
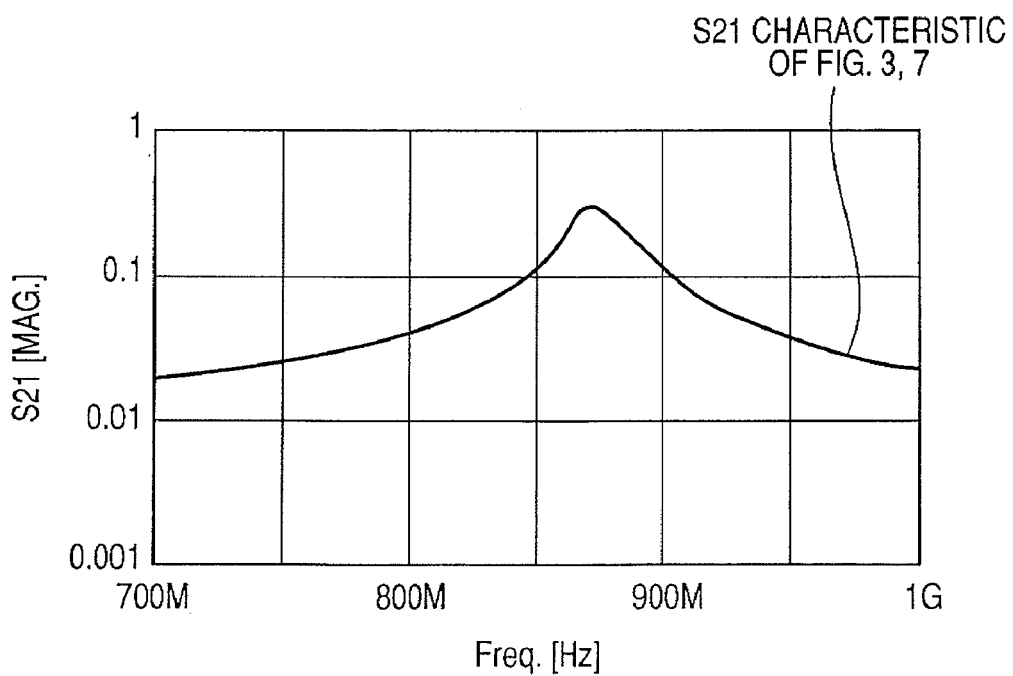
FIG. 10 is a partially enlarged graph illustrating the S21 characteristic of FIG. 9.

FIG. 9 illustrates an S21 characteristic from the IC chip 111 to the power supply 101 in the circuit model of FIG. 8. The graph illustrating the S21 characteristic of the circuit model of FIG. 3 is also superimposed for comparison. As is apparent from FIG. 9, even when the bypass capacitor 222 is attached to the circuit model of FIG. 8, the resonance frequency close to 1 GHz does not change. FIG. 10 is an enlarged portion of the graph of FIG. 9 in a range of 700 MHz to 1 GHz. As is apparent from FIG. 10, the resonance frequency in the circuit model of FIG. 8 is approximately 870 MHz. Even when the bypass capacitor 122 is attached, the resonance frequency does not change.

As described above, according to the circuit structure according to this embodiment, the resonance frequency on the source power supply side is not substantially varied by the influence of the bypass capacitor 122, the power supply paths, and the like. Therefore, even when the value of the bypass capacitor is adjusted corresponding to a frequency at which the noise is large after the completion of the printed wiring board, the resonance frequency of a bypass capacitor of another electrically connected circuit is held. That is, the noise does not increase at a frequency other than the frequency for reduction by arranging the bypass capacitor.

That is, in the case of a bypass capacitor for an IC, a calculated resonance frequency of only a path from the IC to the bypass capacitor is adjusted to a value close to a power ground noise frequency of the IC which is the largest problem. Therefore, even when an EMI problem occurs after the printed wiring board is manufactured, the effect can be exhibited on only the noise frequency which is the problem without changing the characteristic of the entire printed wiring board. Therefore, it is also effective in solving the EMI problem after producing a prototype.

EXAMPLE 2

Next, Example 2 of the present invention will be described. The bypass capacitor 122 provided in Example 1 is used to reduce the noise in the vicinity of 100 MHz and has a capacitance of 1000 pF. In Example 2, assuming that the frequency for reduction is in the vicinity of the 300 MHz, the capacitance of the bypass capacitor 122 is changed from 1000 pF to 200 pF. As in the case of Example 1, a simulation was performed using the circuit structure illustrated in FIG. 3, except for the fact that the capacitance of the bypass capacitor 122 is changed to 200 pF.

Figure 22A:
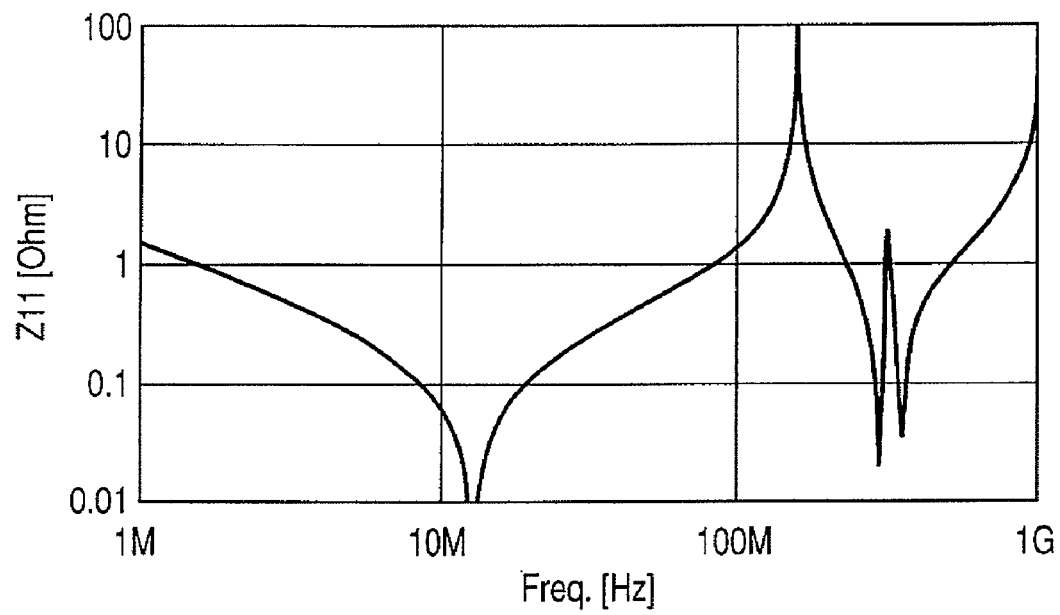
FIGS. 22A, 22B, and 22C are graphs illustrating characteristics of the circuit model of FIG. 3 in Example 2.

FIG. 22A illustrates a Z11 characteristic as observed from the IC chip 111 at respective frequencies. In FIG. 22A, the resonance point of a low impedance sin the vicinity of 10 MHz may be caused by the bypass capacitor 121 and the resonance point of a low impedance in the vicinity of 300 MHz may be caused by the bypass capacitor 122. The resonance point at higher frequencies may be caused by the characteristic of the entire power supply including the power supply paths 102a, 102b, and 102c. That is, the power ground noise in the vicinity of 10 MHz can be reduced by the bypass capacitor 121 and the power ground noise in the vicinity of 300 MHz can be reduced by the bypass capacitor 122 of 200 pF.

Figure 22B:
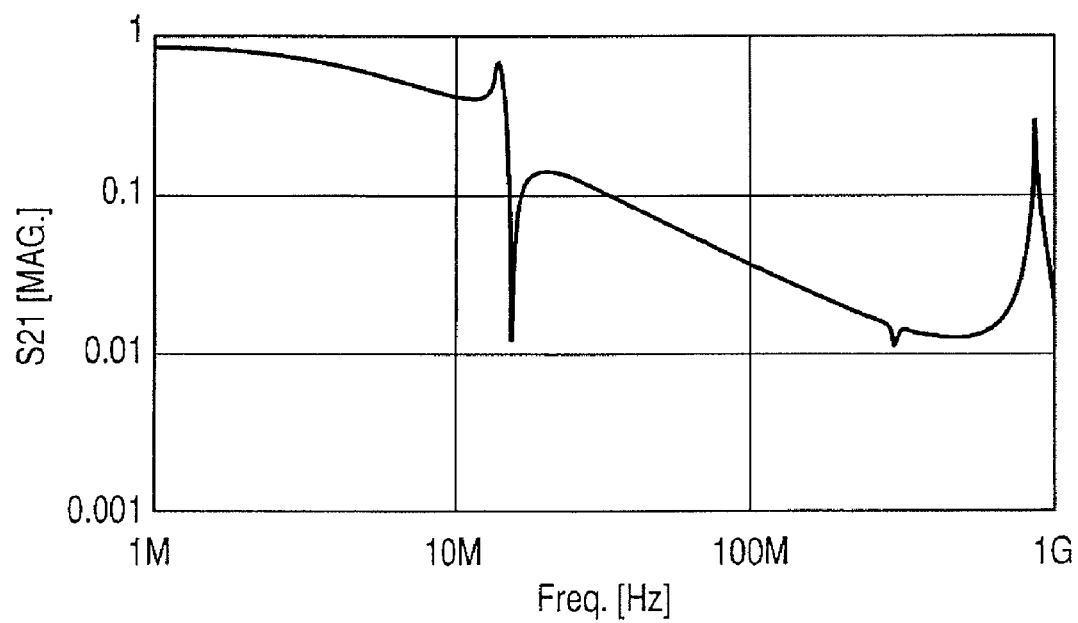

FIG. 22B illustrates an S21 characteristic from the IC chip 111 to the source power supply 101. In FIG. 22B, the point at which the S21 characteristic is high in the vicinity of 10 MHz may be caused by the bypass capacitor 121. In the vicinity of 300 MHz, there is no point at which the S21 characteristic is high. The resonance point at a higher frequency may be caused by the characteristic of the entire power supply including the power supply paths 102a, 102b, and 102c. That is, the power ground noise in the vicinity of 10 MHz is more likely to be propagated to the outside of the IC chip by the bypass capacitor 121. In contrast, the power ground noise in the vicinity of 300 MHz is hardly propagated to the outside of the IC chip.

Figure 22C:

FIG. 22C illustrates an enlarged portion, in a frequency range including 300 MHz which is close to the resonance point of the bypass capacitor 122, of a graph illustrating that the Z11 characteristic of FIG. 22A is superimposed on the S21 characteristic of FIG. 22B.

As is apparent from FIG. 22C, the S21 characteristic does not deteriorate in the vicinity of the resonance frequency (295 MHz) at which the bypass capacitor 122 acts most effectively. Therefore, when the resonance frequency of the bypass capacitor 122 is adjusted to a frequency at which a power ground noise is maximum, the tendency that the power ground noise corresponding to the operating frequency can be reduced to prevent the power ground noise from propagating to the power supply side is reproduced on the IC chip.

Next, the fact that the resonance frequency of the bypass capacitor can be determined with high precision by the circuit structure according to Example 2 will be described. A simulation was performed with the capacitance of the bypass capacitor 122 in the circuit model of FIG. 5 set to 200 pF (parasitic inductance 0.5 nH×2). In each case using the circuit model of FIG. 5 as described below, the capacitance of the bypass capacitor 122 was changed from 1000 pF to 200 pF.

Figure 23:
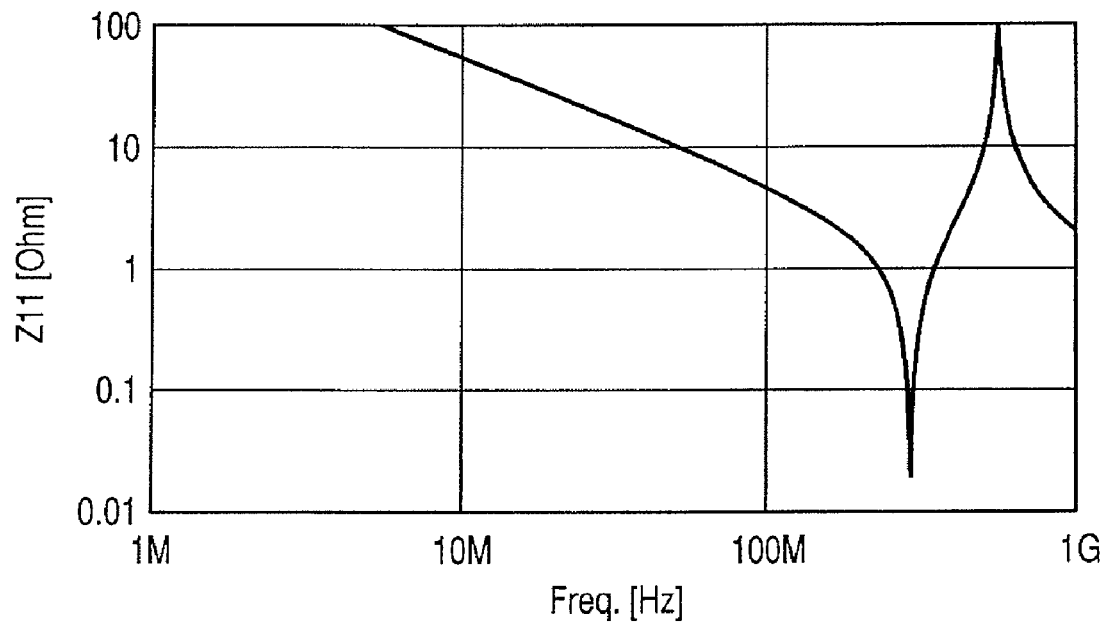
FIG. 23 is a graph illustrating a Z11 characteristic of the circuit model of FIG. 5 in Example 2.

FIG. 23 illustrates a Z11 (impedance) characteristic in a case where the circuit model of FIG. 5 is observed from the IC chip 111. In FIG. 23, a resonance frequency of a low impedance in the vicinity of 300 MHz is caused by the bypass capacitor 122.

Figure 24:
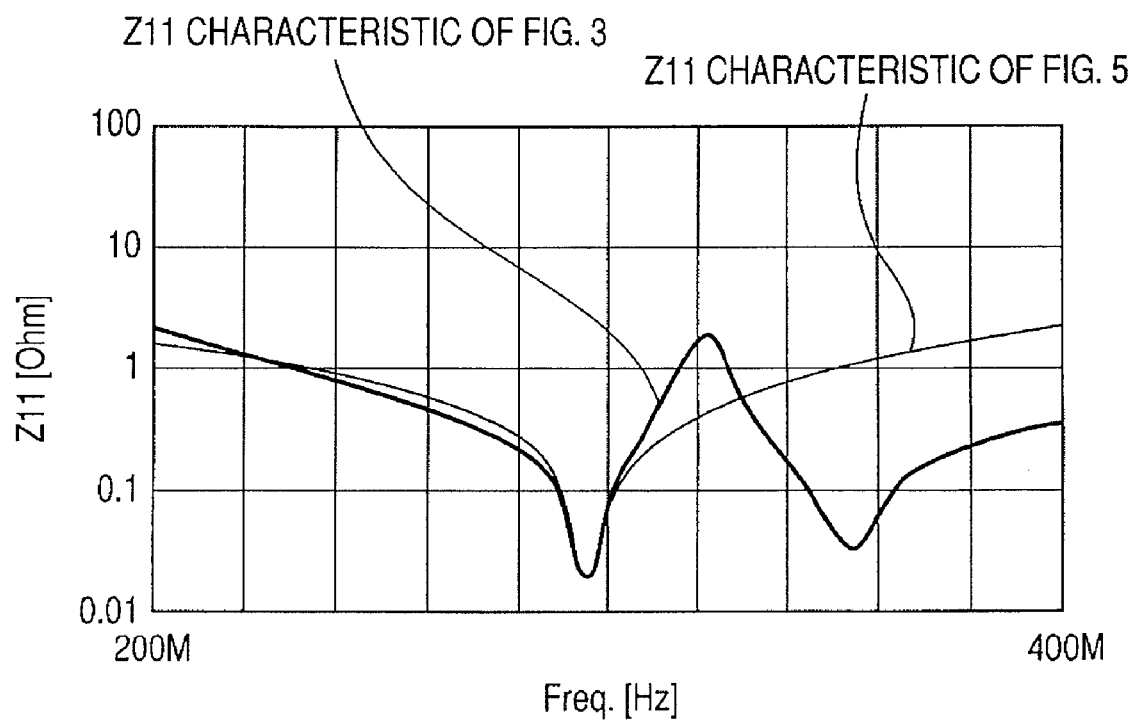
FIG. 24 is a partially enlarged graph illustrating the Z11 characteristics of the circuit model of FIG. 5 in Example 2.

FIG. 24 illustrates a superimposition of enlarged portions of the graphs of FIGS. 22A and 23 in the vicinity of the resonance frequency (vicinity of 300 MHz) of the bypass capacitor 122. The resonance frequency in the graph of FIG. 22A and the resonance frequency in the graph of FIG. 23 each are approximately 295 MHz and thus substantially equal to each other. That is, even when the complex influence of the bypass capacitor 121 located on the power supply side is not taken into account, the tendency that the resonance point can be easily determined is reproduced here only in view of the influence of the bypass capacitor 122, the IC chip 111, and the power supply path 112a for bypass capacitor.

Figure 25:
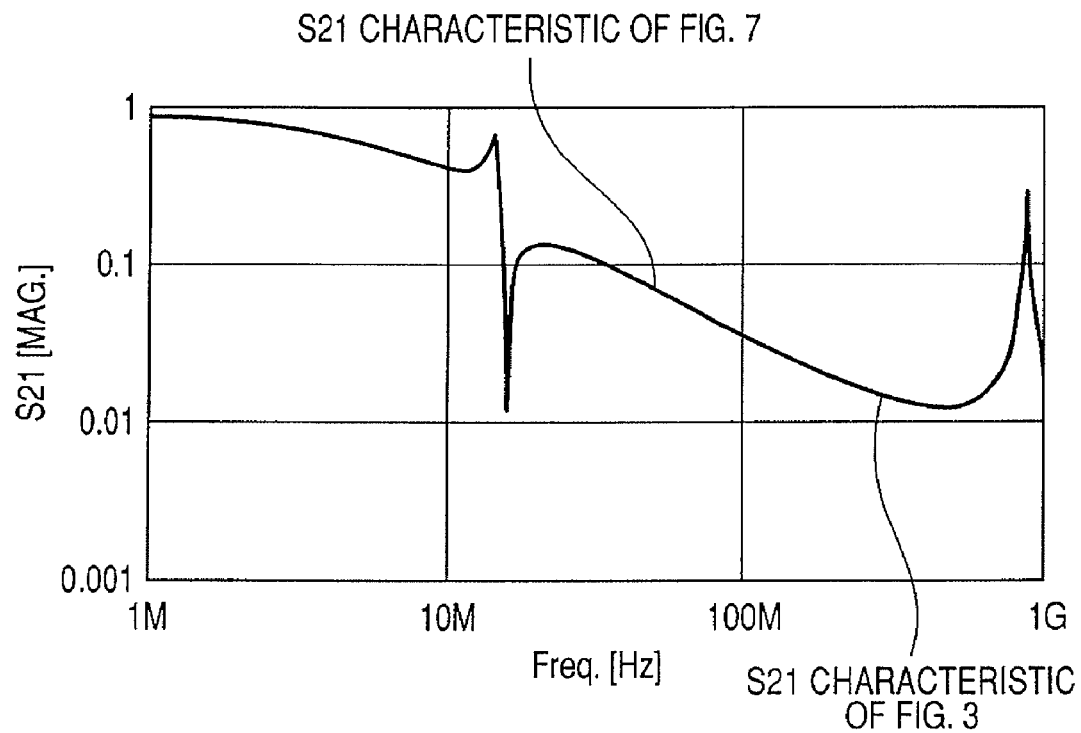
FIG. 25 is a graph illustrating an S21 characteristic of the circuit model of FIG. 4 in Example 2.

Next, the fact that the resonance frequency of the power supply path for another bypass capacitor is not influenced by the circuit structure according to Example 2 will be described. A simulation was performed with the capacitance of the bypass capacitor 122 in the circuit model of FIG. 8 set to 200 pF (parasitic inductance 0.5 nH×2). FIG. 25 illustrates an S21 characteristic from the IC chip 111 to the source power supply 101 in the circuit model of FIG. 8. The graph illustrating the S21 characteristic of the circuit model of FIG. 3 is also superimposed for comparison.

Figure 26:
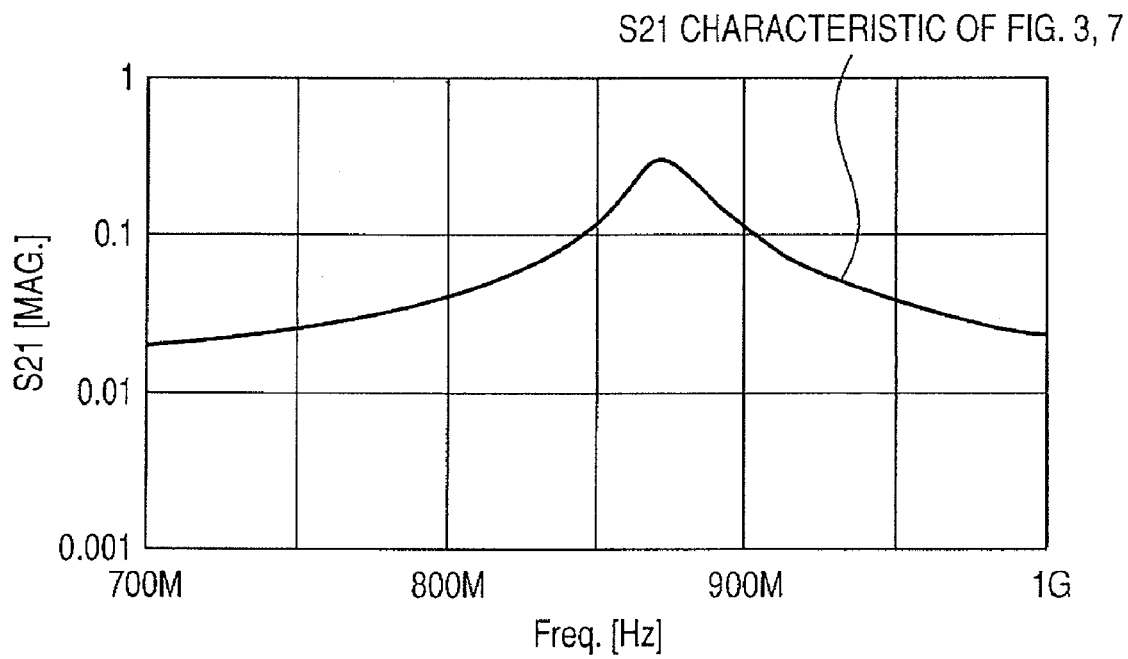
FIG. 26 is a partially enlarged graph illustrating an S21 characteristic of the circuit model of FIG. 8 in Example 2.

As is apparent from FIG. 25, even when the bypass capacitor 222 is attached to the circuit model of FIG. 3, the resonance frequency close to 1 GHz does not change. FIG. 26 is a graph illustrating an enlarged portion of FIG. 25 in a range of 700 MHz to 1 GHz. As is apparent from FIG. 10, the resonance frequency in the circuit model of FIG. 9 is approximately 870 MHz and the resonance frequency does not change even when the bypass capacitor 122 is attached.

As described above, according to the circuit structure according to Example 2, the resonance frequency on the source power supply side is not substantially varied by the influence of the bypass capacitor 122, the power supply paths, and the like. Therefore, even when the value of the bypass capacitor is adjusted corresponding to a frequency at which the noise is large after the completion of the printed wiring board, the resonance frequency of a bypass capacitor of another electrically connected circuit is held. That is, when the bypass capacitor is arranged, the noise does not increase at a frequency other than the frequency for reduction.

COMPARATIVE EXAMPLE 1

Figure 13:
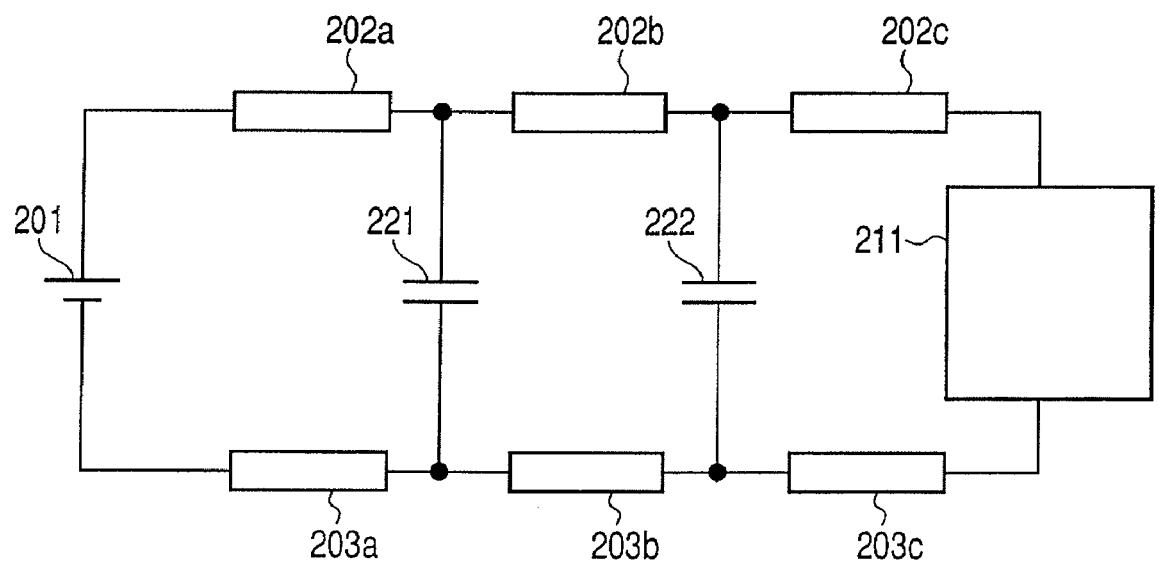
FIG. 13 illustrates a circuit model for simulation in a conventional example.

In order to examine the effect of Example 1, a simulation was performed with the capacitance of the high-frequency bypass capacitor 222 in the circuit model of FIG. 13 set to 200 pF (parasitic inductance 0.5 nH×2). In each case using the circuit model of FIG. 13 as described below, the capacitance of the high-frequency bypass capacitor 222 was changed from 1000 pF to 200 pF.

Figure 27A:
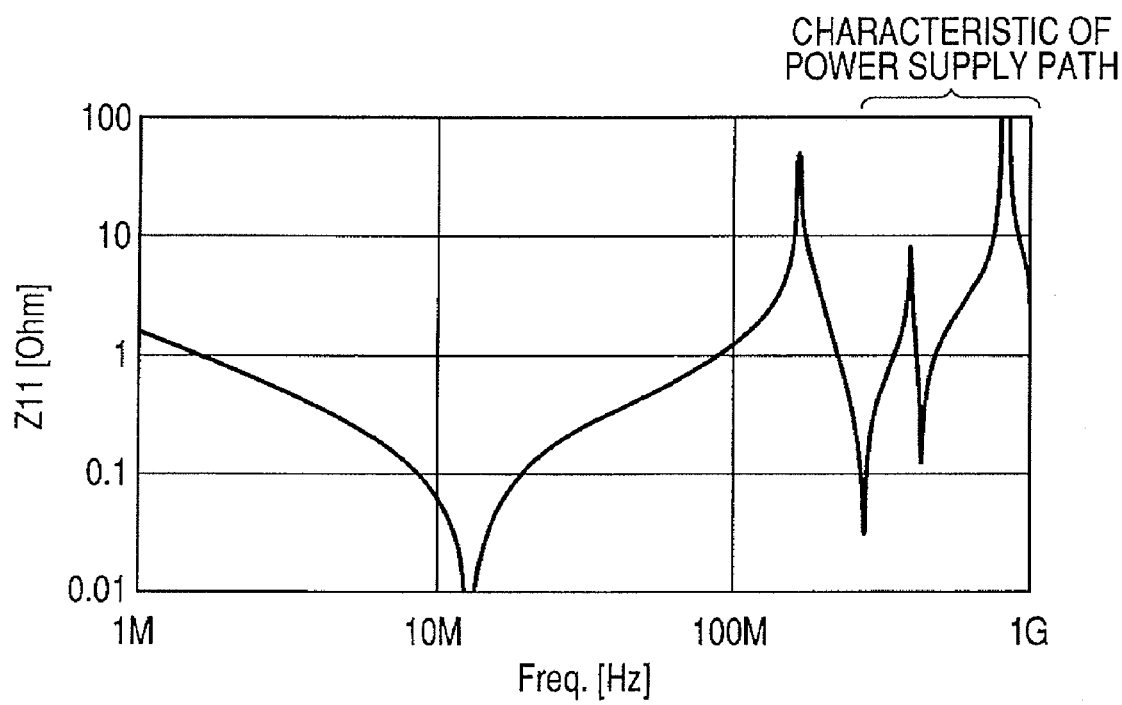
FIGS. 27A, 27B, and 27C are graphs illustrating Z-characteristics of the circuit model of FIG. 13 in Comparative Example 1.

FIG. 27A illustrates a Z11 (impedance) characteristic in a case where the circuit model of FIG. 13 is observed from the IC chip 211 with the capacitance of the high-frequency bypass capacitor 222 set to 200 pF (parasitic inductance 0.5 nH×2). In FIG. 27A, the resonance point of a low impedance in the vicinity of 10 MHz may be caused by the bypass capacitor 221 and the resonance point of a low impedance in the vicinity of 300 MHz may be caused by the bypass capacitor 222. The resonance point at a higher frequency may be caused by the characteristic of the entire power supply including the power supply paths 202a, 202b, and 202c. That is, the power ground noise in the vicinity of 10 MHz can be reduced by the bypass capacitor 221 and the power ground noise in the vicinity of 300 MHz can be reduced by the bypass capacitor 222.

Figure 27B:
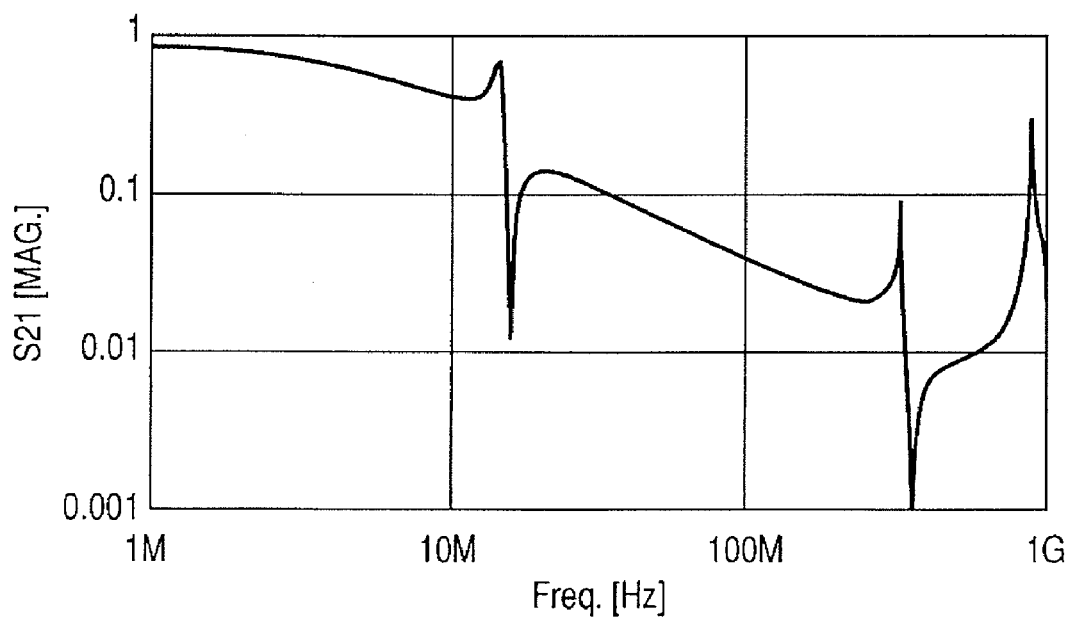

FIG. 27B illustrates an S21 (transmission) characteristic from the IC chip 211 to the source power supply 201 in the circuit model of FIG. 13. In FIG. 27B, the point at which the S21 characteristic is high in the vicinity of 10 MHz may be caused by the bypass capacitor 221 and the point at which the S21 characteristic is high in the vicinity of 300 MHz may be caused by the bypass capacitor 222. The resonance point at a higher frequency may be caused by the characteristic of the entire power supply including the power supply paths 202a, 202b, and 202c. That is, the power ground noise having a frequency in the vicinity of 10 MHz and the power ground noise having a frequency in the vicinity of 100 MHz are more likely to be propagated to the outside of the IC chip due to the bypass capacitors 221 and 222.

Figure 27C:
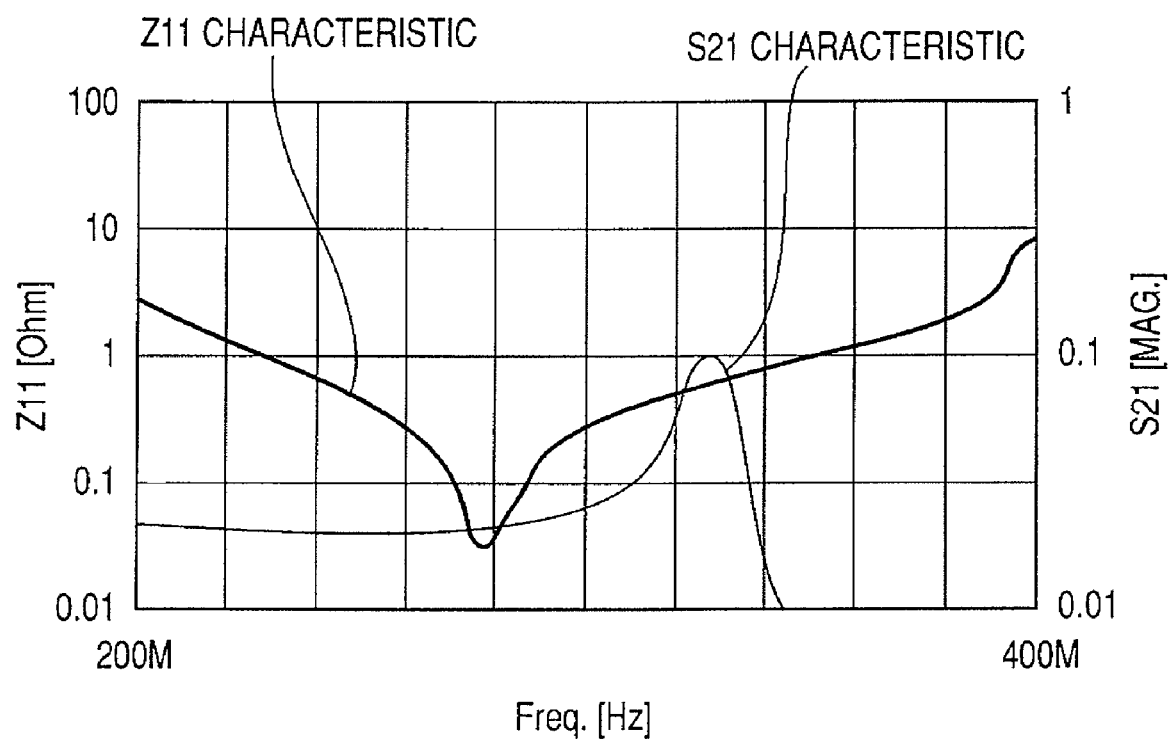

FIG. 27C illustrates an enlarged portion in a frequency range (vicinity of 300 MHz) which is close to the resonance point of the bypass capacitor 222, of a graph illustrating that the Z11 characteristic of FIG. 27A is superimposed on the S21 characteristic of FIG. 27B in the circuit structure of FIG. 13. As is apparent from the Z11 characteristic of FIG. 27C, the resonance frequency at which the bypass capacitor 222 acts most effectively is in a frequency band of the vicinity of 275 MHz. In contrast, a frequency band in which the S21 characteristic deteriorates corresponds to the vicinity of 330 MHz. Therefore, when the resonance frequency of the bypass capacitor 222 is adjusted to a frequency at which a power ground noise is maximum (275 MHz), the impedance of the IC chip is reduced at this resonance frequency to reduce the power ground noise. However, the resonance frequency is close to the frequency band in which the S21 characteristic deteriorates, so the power ground noise propagating to the outside increases.

Even when the value of the high-frequency bypass capacitor is changed from 1000 pF to 200 pF, it is difficult to accurately determine the resonance frequency of the bypass capacitor. In order to exhibit this fact, calculation was performed by a simulation using the circuit model illustrated in FIG. 16 with the value of the bypass capacitor 222 changed to 200 pF. In each case using the circuit model of FIG. 16 as described below, the capacitance of the high-frequency bypass capacitor 222 was changed from 1000 pF to 200 pF.

Figure 16:
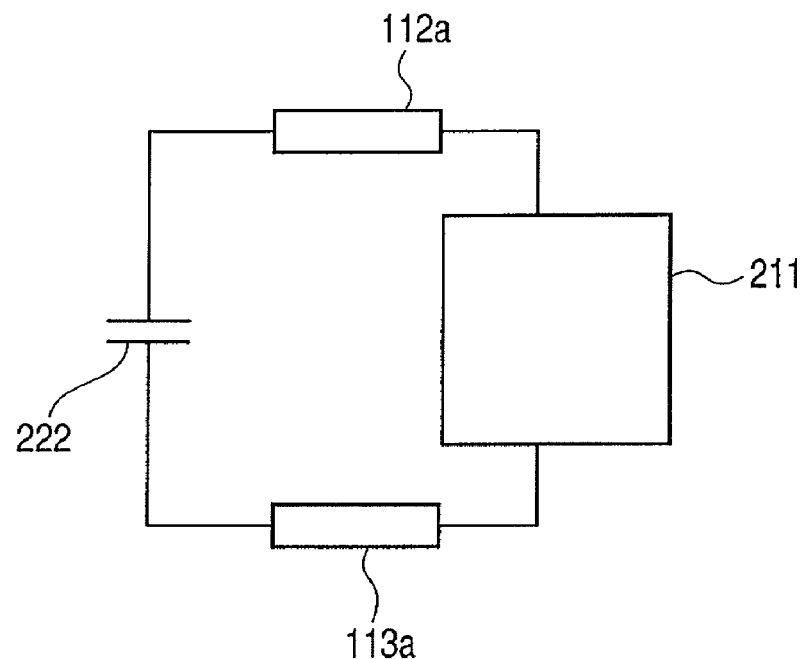
FIG. 16 illustrates a circuit model for comparison simulation in the conventional example.
Figure 17:
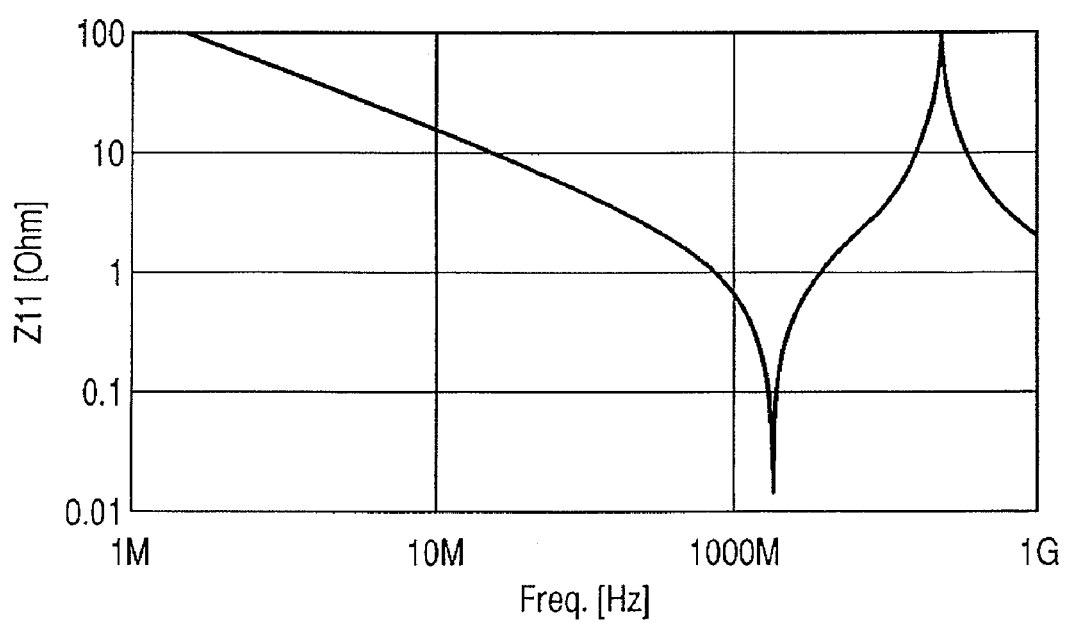
FIG. 17 is a graph illustrating a Z11 characteristic of the circuit model of FIG. 16.
Figure 18:
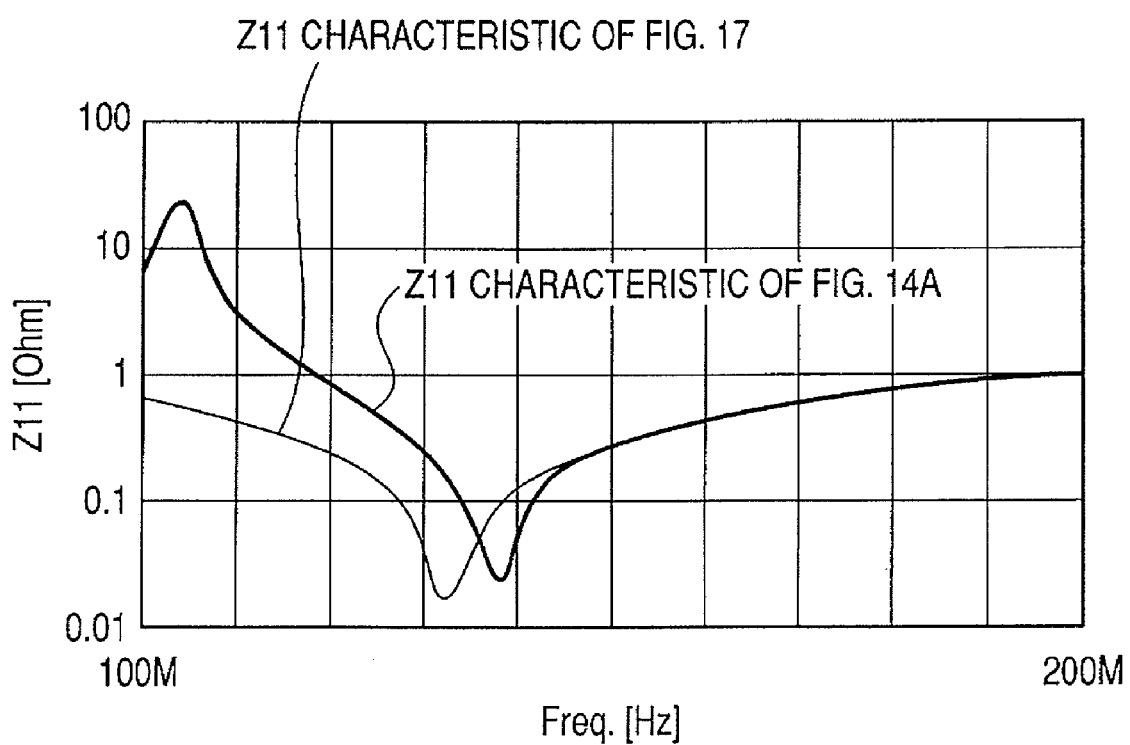
FIG. 18 is a partially enlarged graph illustrating the Z11 characteristic of FIG. 17.
Figure 28:
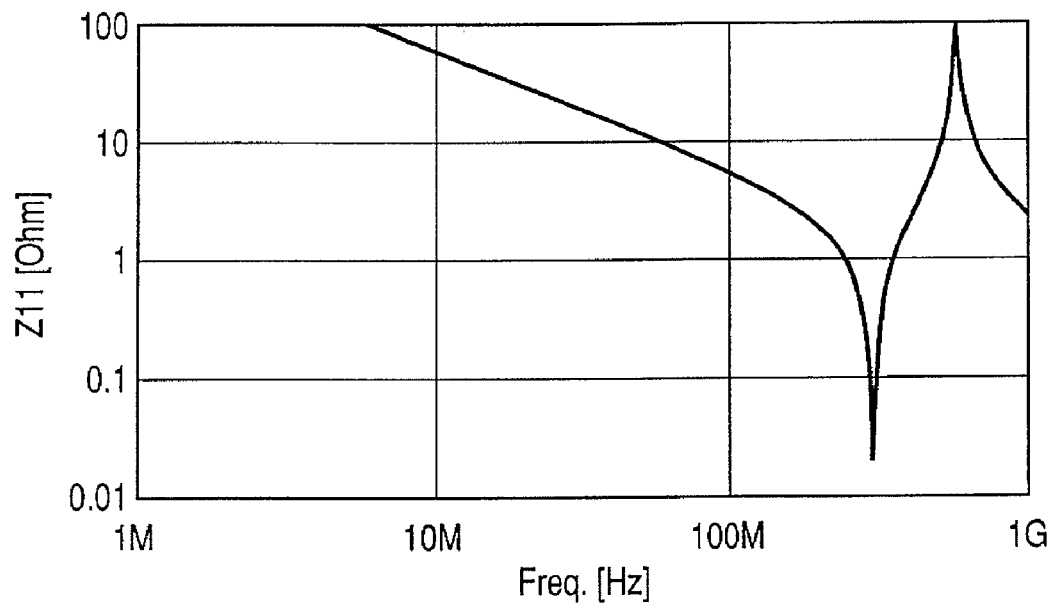
FIG. 28 is a graph illustrating a Z11 characteristic of the circuit model of FIG. 16 in Comparative Example 1.

FIG. 28 illustrates a Z11 (impedance) characteristic in the case where the circuit model of FIG. 16 is observed from the IC chip 211. In FIG. 28, the resonance point of a low impedance in the vicinity of 300 MHz is caused by the bypass capacitor 222.

Figure 29:
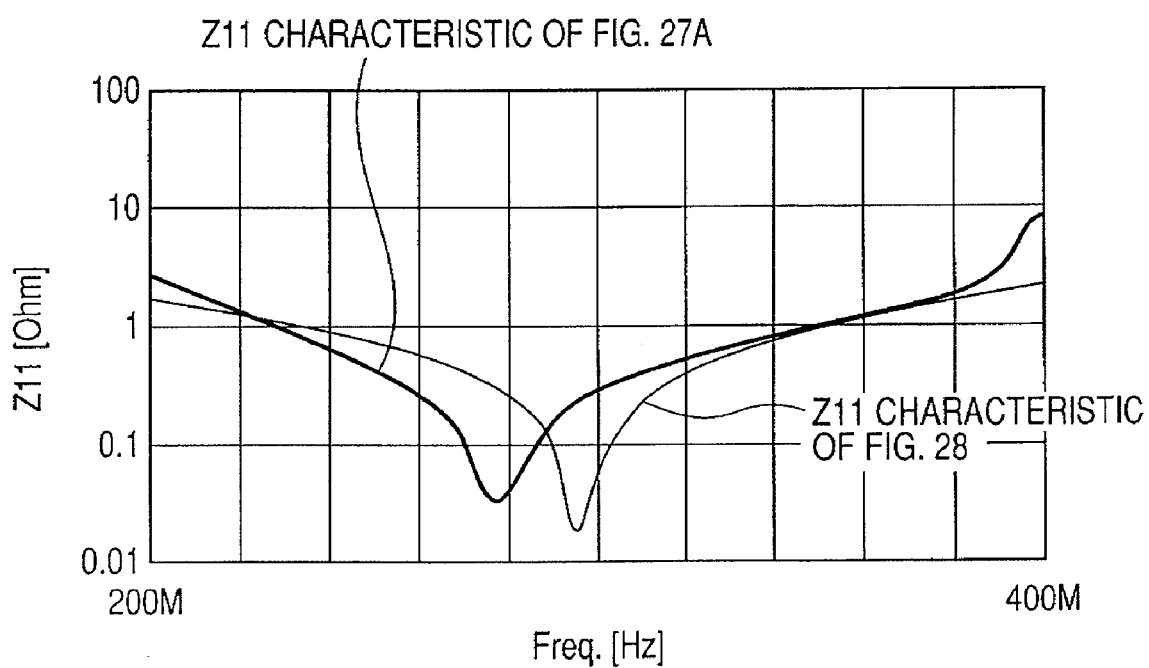
FIG. 29 is a partially enlarged graph illustrating the Z11 characteristic of FIG. 28.

FIG. 29 illustrates a superimposition of enlarged portions of the graphs of FIGS. 27A and 28 in the vicinity of the resonance frequency (vicinity of 300 MHz) of the bypass capacitor 222. The resonance frequency of FIG. 27A is approximately 275 MHz and the resonance frequency of FIG. 28 is approximately 295 MHz. That is, the resonance frequency (approximately 295 MHz) corresponding to the characteristic of the bypass capacitor 222 is changed to approximately 275 MHz by the influence of the power supply paths 202a and 203a and the bypass capacitor 221. Therefore, when the complicated influence of other paths and other electronic parts is not taken into account, the tendency that the resonance point of the bypass capacitor 222 cannot be accurately determined under ordinary conditions is reproduced here.

Figure 30:
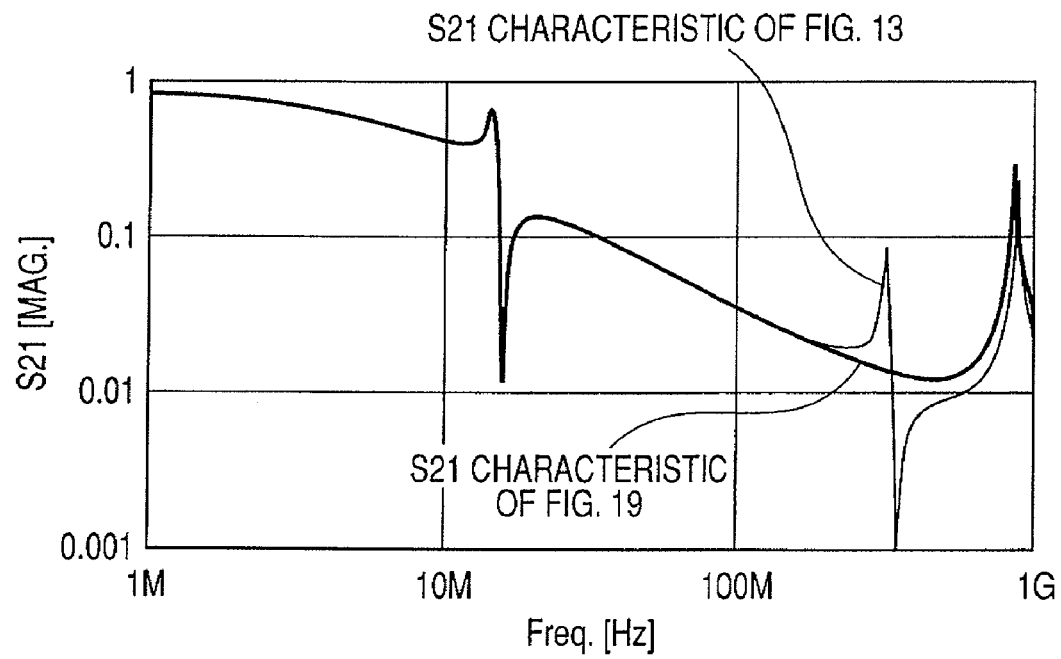
FIG. 30 is a graph illustrating an S21 characteristic of the circuit model of FIG. 19 in Comparative Example 1.

FIG. 30 illustrates an S21 characteristic from the IC chip 211 to the power supply 201 in the case of the circuit model of FIG. 13 and illustrates an S21 characteristic from the IC chip 211 to the power supply 201 in a case where the bypass capacitor 222 is removed from the circuit model of FIG. 13. As is apparent from FIG. 30, when the bypass capacitor 222 is attached to the circuit model of FIG. 13, the resonance frequency close to 1 GHz changes.

Figure 19:
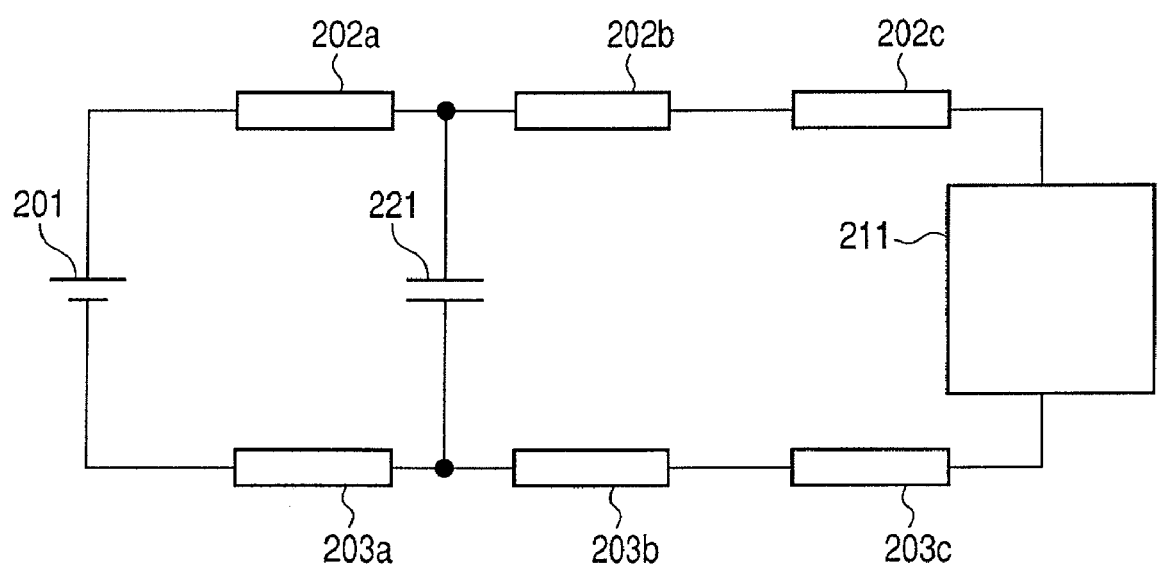
FIG. 19 illustrates a circuit model for comparison simulation in the conventional example.
Figure 20:
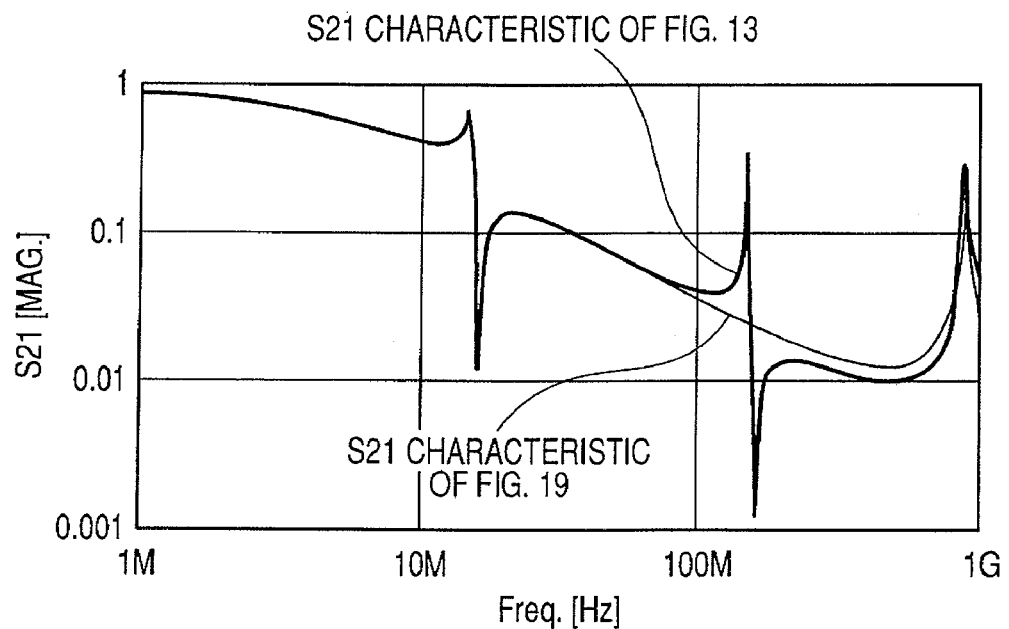
FIG. 20 is a graph illustrating a S21 characteristic of the circuit model of FIG. 19.
Figure 21:
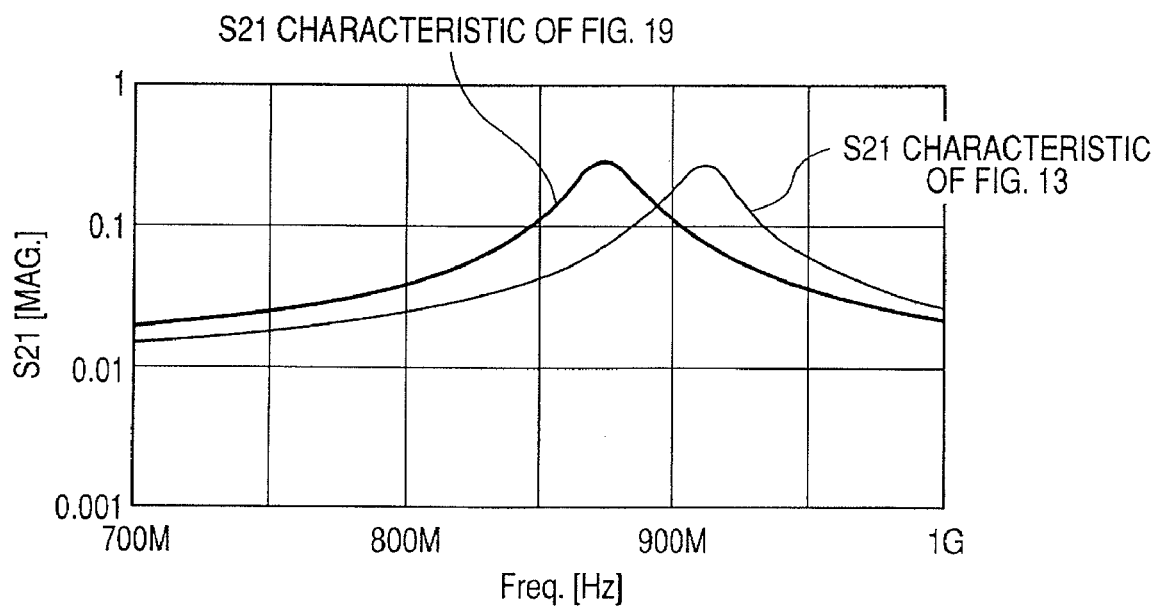
FIG. 21 is a partially enlarged graph illustrating the S21 characteristic of FIG. 20.
Figure 31:
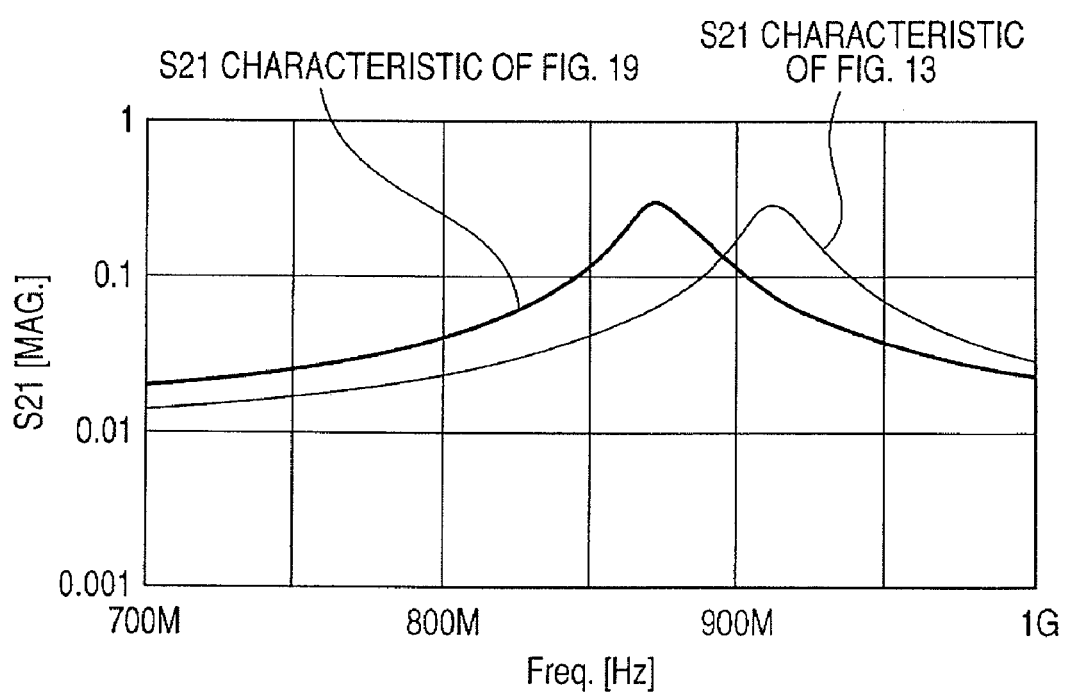
FIG. 31 is a partially enlarged graph illustrating the S21 characteristic of FIG. 30.

FIG. 31 is a graph illustrating an enlarged portion of FIG. 30 in a range of 700 MHz to 1 GHz. As is apparent from FIG. 31, the resonance frequency in the circuit model of FIG. 13 is approximately 910 MHz. In contrast, the resonance frequency in the circuit model of FIG. 19 from which the bypass capacitor 222 is removed is approximately 870 MHz. That is, when the bypass capacitor 222 is attached, the tendency that the resonance frequency close to 900 MHz changes is also reproduced.

Embodiment 2

In Embodiment 1, the printed circuit board in which the power supply paths are separated from each other and the GND paths are separated from each other is described. However, the present invention has a sufficient effect even in the case where the GND paths are not separated from each other and only the power supply paths are separated from each other.

Figure 11:
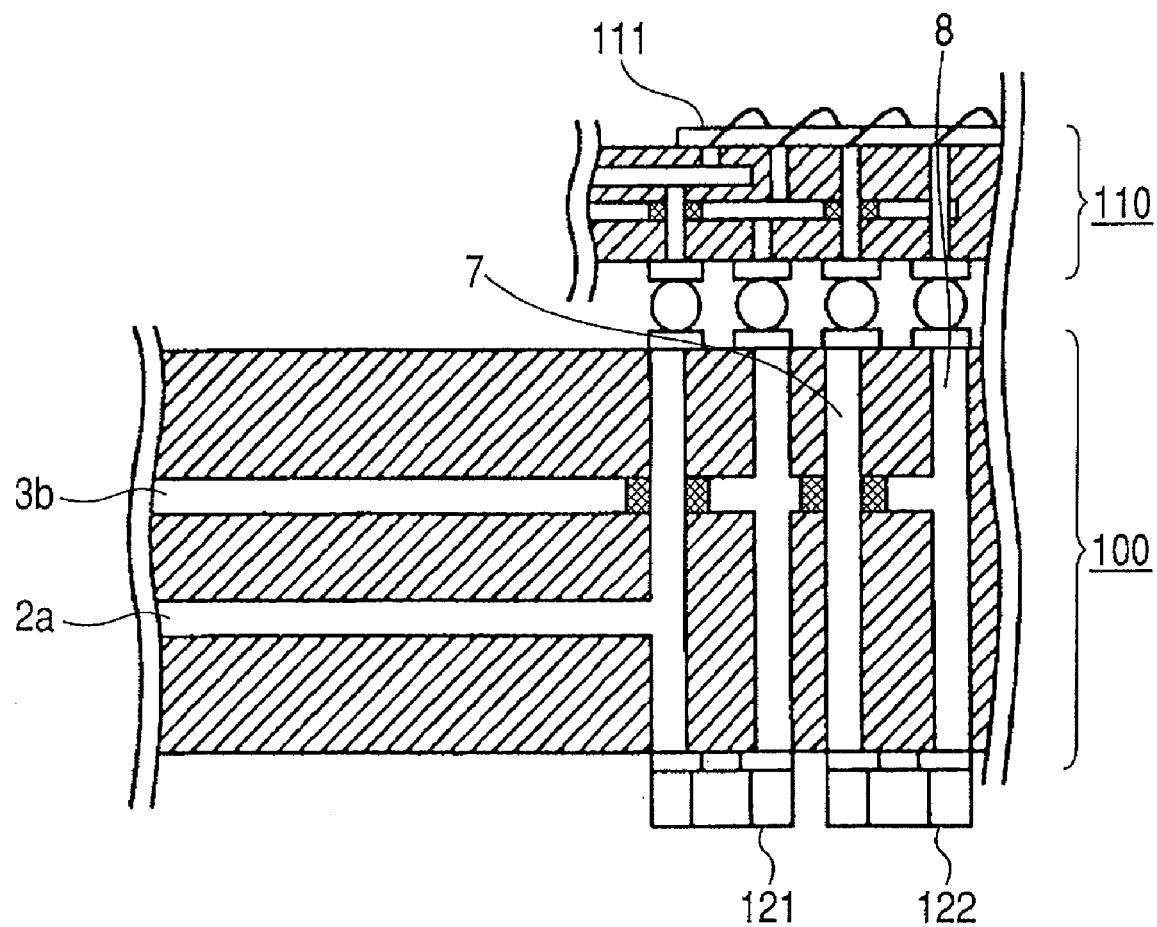
FIG. 11 is a cross sectional view illustrating a printed circuit board according to Embodiment 2 of the present invention.
Figure 12A:
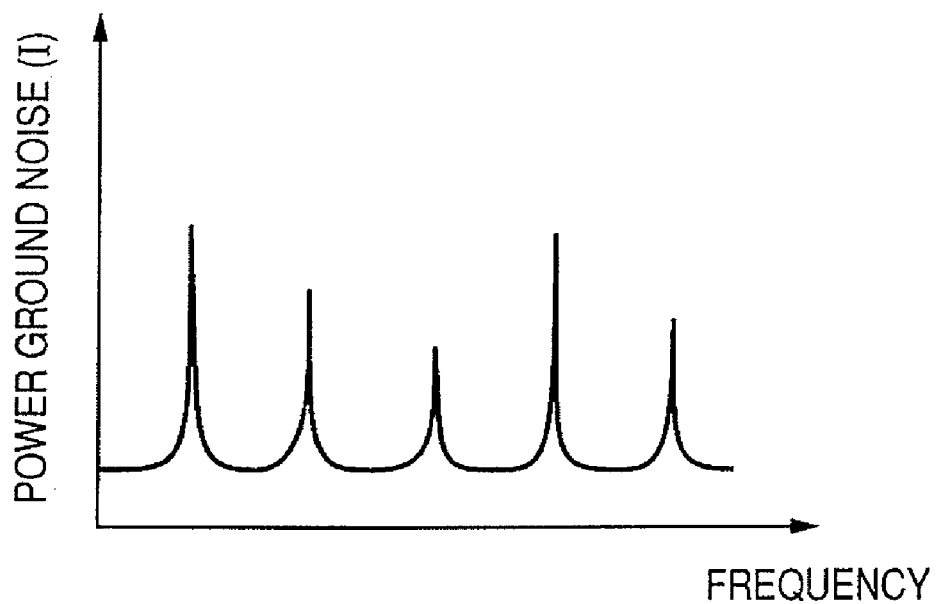
FIGS. 12A and 12B are graphs illustrating a frequency characteristic of a power ground noise and a frequency characteristic of a bypass capacitor.
Figure 12B:
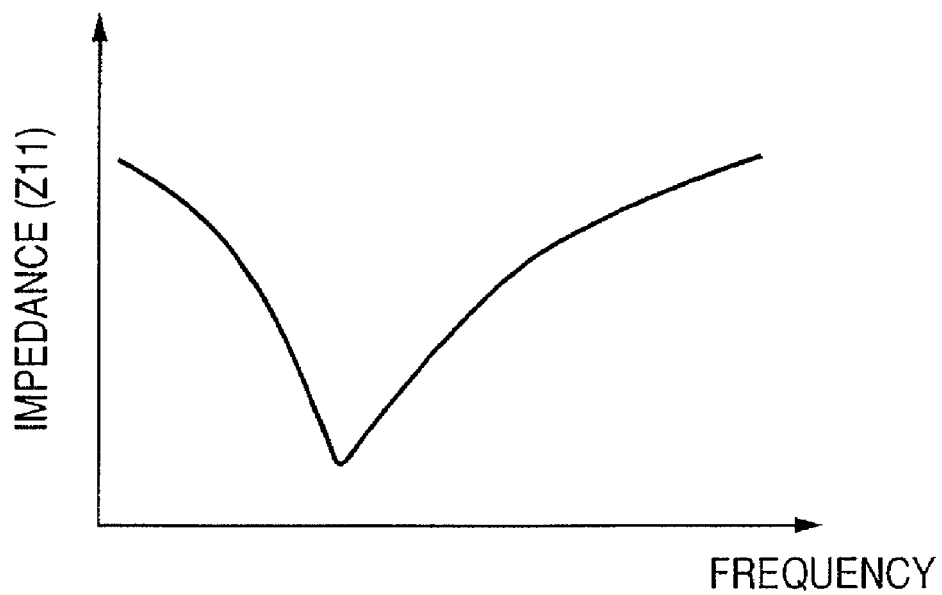

FIG. 11 is a cross sectional view illustrating a circuit structure according to Embodiment 2. This embodiment is different from Embodiment 1 in that the supply-side GND wiring 3 is connected to not only the through hole 6 but also the through hole 8. Even in this embodiment, substantially the same effect as the effect of Embodiment 1 can be obtained.

In Embodiment 1, the IC chip 111 is connected to the IC package 110 by wire bonding. However, the present invention is not limited to this and thus bump connection for flip-chip mounting may also be employed. The IC package 110 is not limited to a BGA package and thus a QFP package or a flip-chip package may also be used. The number of bypass capacitors is not limited.

Figure 32:
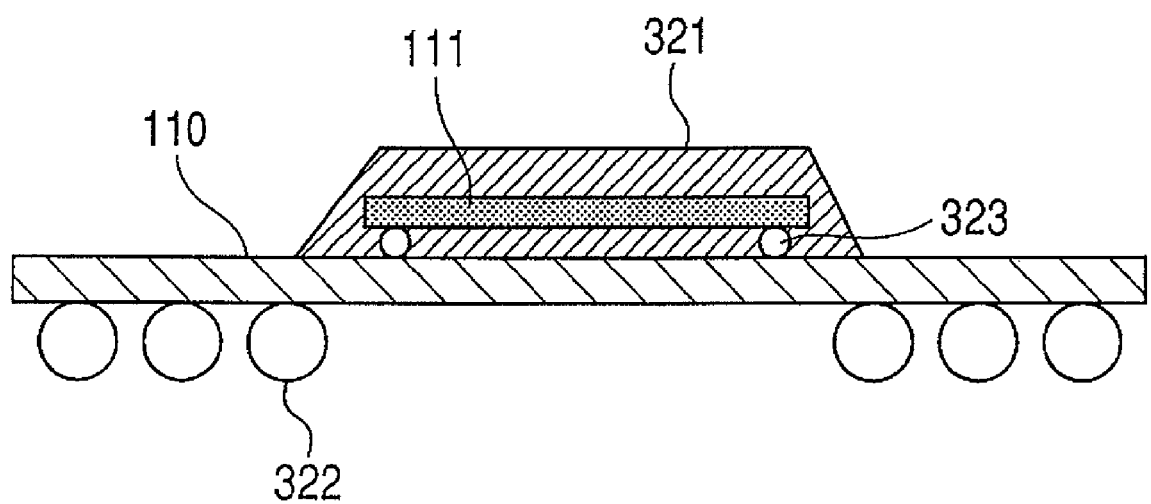
FIG. 32 is a schematic diagram illustrating another embodiment of the present invention.

FIG. 32 is a schematic diagram illustrating a state in which the IC chip 111 is connected to the IC package 110 with flip-chip mounting. In FIG. 32, reference numeral 110 denotes the IC package, 111 denotes the IC chip, 321 denotes a seal resin, 322 denotes solder balls each of which is a connection terminal. Bumps 323 are used to connect the IC chip 111 with the IC package 110.

According to the present invention, the power ground noise can be inhibited from causing not only a variation in timing of an IC and a malfunction thereof but also a malfunction of another IC and the generation of an EMI noise in the case where the power ground noise propagates to the power supply side. Therefore, it is possible to produce a system capable of simultaneously avoiding the risk of malfunction of the IC, a malfunction of a device located outside the IC, and an EMI problem particularly in a high frequency range close to the resonance point of a bypass capacitor.

According to the present invention, there is the advantage that the resonance frequency of the bypass capacitor is easily determined. That is, the resonance frequency can be determined with high precision only by taking the independent power supply path up to each bypass capacitor into account.

Even when the bypass capacitor is changed, the resonance frequency of a power supply path for another bypass capacitor is not influenced. Therefore, the power ground noise does not increase at a frequency independent of the resonance frequency of the bypass capacitor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-166820, filed Jun. 16, 2006, and Japanese Patent Application No. 2007-129306, filed May 15, 2007, which are hereby incorporated by reference herein in their entirety.

What is claimed is:

1. A printed circuit board, comprising:
a printed wiring board;
a semiconductor which is mounted on the printed wiring board and includes a semiconductor chip, the semiconductor having a first power supply terminal, a second power supply terminal, a first ground terminal, and a second ground terminal;
a first circuit for supplying power to the semiconductor chip, the first circuit comprising:
a source power supply,
a first power supply wiring for connecting the first power supply terminal of the semiconductor with the source power supply,
a first ground wiring for connecting the first ground terminal of the semiconductor with the source power supply, and
a first bypass capacitor which connects the first power supply wiring and the first ground wiring; and
a second circuit comprising:
a second power supply wiring connected to the second power supply terminal of the semiconductor,
a second ground wiring connected to the second ground terminal of the semiconductor, and
a second bypass capacitor which connects the second power supply wiring and the second ground wiring,
wherein:
the first power supply terminal and the second power supply terminal are at the same potential;
the first power supply terminal is electrically connected to the second power supply terminal only within the semiconductor; and
the first ground wiring is electrically connected to the second ground wiring only within the semiconductor.

2. A printed circuit board according to claim 1, wherein:
the printed circuit board has a multilayer structure including a power supply layer and a ground layer;
the first power supply wiring is comprised of a power supply wiring provided in the power supply layer and a first through hole;
the first ground wiring is comprised of a ground wiring provided in the ground layer and a second through hole;
the first bypass capacitor is connected to the semiconductor through the first through hole and the second through hole;
the second power supply wiring is comprised of a third through hole;
the second ground wiring is comprised of a fourth through hole; and
the second bypass capacitor is connected to the semiconductor through the third through hole and the fourth through hole.

3. A printed circuit board according to claim 1, wherein:
the first power supply wiring and the second power supply wiring each are connected to the IC chip through a power supply pattern and a bonding wire within the semiconductor and are connected to each other in the IC chip; and
the first ground wiring and the second ground wiring each are connected to the IC chip through a ground pattern and a bonding wire within the semiconductor and are connected to each other in the IC chip.

4. A printed circuit board according to claim 1, wherein:
the first bypass capacitor has a resonance frequency in a first frequency band; and the second bypass capacitor has a resonance frequency in a second frequency band higher than the first frequency band.

5. A printed circuit board according to claim 4, wherein:
the first bypass capacitor reduces a power ground noise of the IC chip at an operating frequency within the first frequency band; and
the second bypass capacitor reduces a power ground noise of the IC chip at an operating frequency within the second frequency band and reduces propagation of the power ground noise in the second frequency band to a side of the source power supply.

6. A printed circuit board according to claim 5, wherein an S21 characteristic (transmission characteristic) from the semiconductor chip to the source power supply in the second frequency band is free from a resonance frequency at which the transmission characteristic has a peak.

7. A printed circuit board, comprising:
a printed wiring board;
a semiconductor which is mounted on the printed wiring board and includes a semiconductor chip, the semiconductor having a first power supply terminal, a second power supply terminal, a first ground terminal, and a second ground terminal;
a first circuit for supplying power to the semiconductor chip, the first circuit comprising:
a source power supply,
a first power supply wiring for connecting the first power supply terminal of the semiconductor with the source power supply,
a first ground wiring for connecting the first ground terminal of the semiconductor with the source power supply, and
a first bypass capacitor which connects the first power supply wiring and the first ground wiring; and
a second circuit comprising:
a second power supply wiring connected to the second power supply terminal of the semiconductor;
a second ground wiring for connecting the second ground terminal of the semiconductor with the source power supply; and
a second bypass capacitor which connects the second power supply wiring and the second ground wiring, wherein:
the first power supply terminal and the second power supply terminal are at the same potential; and
the first power supply terminal is electrically connected to the second power supply terminal only within the semiconductor.

8. A printed circuit board according to claim 7, wherein:
the printed circuit board has a multilayer structure including a power supply layer and a ground layer;
the first power supply wiring is comprised of a power supply wiring provided in the power supply layer and a first through hole;
the first ground wiring is comprised of a ground wiring provided in the ground layer and a second through hole;
the first bypass capacitor is connected to the semiconductor through the first through hole and the second through hole;
the second power supply wiring is comprised of a power supply wiring provided in the power supply layer and a third through hole;
the second ground wiring is comprised of a fourth through hole; and the second bypass capacitor is connected to the semiconductor through the third through hole and the fourth through hole.

9. A printed circuit board according to claim 7, wherein:
the first power supply wiring and the second power supply wiring each are connected to the IC chip through a power supply pattern and a bonding wire within the semiconductor and are connected to each other in the IC chip; and
the first ground wiring and the second ground wiring each are connected to the IC chip through a ground pattern and a bonding wire within the semiconductor and are connected to each other in the IC chip.

10. A printed circuit board according to claim 7, wherein:
the first bypass capacitor has a resonance frequency in a first frequency band; and
the second bypass capacitor has a resonance frequency in a second frequency band higher than the first frequency band.

11. A printed circuit board according to claim 10, wherein:
the first bypass capacitor reduces a power ground noise of the IC chip at an operating frequency within the first frequency band; and
the second bypass capacitor reduces a power ground noise of the IC chip at an operating frequency within the second frequency band and reduces propagation of the power ground noise in the second frequency band to a side of the source power supply.

12. A printed circuit board according to claim 11, wherein an S21 characteristic (transmission characteristic) from the semiconductor chip to the source power supply in the second frequency band is free from a resonance frequency at which the transmission characteristic has a peak.

13. A circuit structure for power supply, comprising:
a semiconductor chip;
a source power supply;
a first circuit for supplying power to the semiconductor chip, the first circuit comprising:
the semiconductor chip,
the source power supply,
a first power supply path for connecting the semiconductor chip with the source power supply,
a first ground path for connecting the semiconductor chip with the source power supply, and
a first bypass capacitor which connects the first power supply path and the first ground path; and
a second circuit comprising:
the semiconductor chip,
a second bypass capacitor,
a second power supply path for connecting the semiconductor chip with the second bypass capacitor, and
a second ground path for connecting the semiconductor chip with the second bypass capacitor, wherein:
the first power supply path and the second power supply path are at the same potential and are electrically connected to each other only within the semiconductor chip.

14. A circuit structure for power supply according to claim 13, wherein:
the first bypass capacitor has a resonance frequency in a first frequency band; and
the second bypass capacitor has a resonance frequency in a second frequency band higher than the first frequency band.

15. A circuit structure for power supply according to claim 14, wherein:

the first bypass capacitor reduces a power ground noise of the IC chip at an operating frequency within the first frequency band; and the second bypass capacitor reduces a power ground noise of the IC chip at an operating frequency within the second frequency band and reduces propagation of the power ground noise in the second frequency band to a side of the source power supply.

16. A circuit structure for power supply according to claim 14, wherein an S21 characteristic (transmission characteristic) from the semiconductor chip to the source power supply in the second frequency band is free from a resonance frequency at which the transmission characteristic has a peak.

* * * * *